(12) United States Patent
Ko et al.

(10) Patent No.: US 8,449,128 B2
(45) Date of Patent: May 28, 2013

(54) SYSTEM AND METHOD FOR A LENS AND PHOSPHOR LAYER

(75) Inventors: Hyunchul Ko, Austin, TX (US);
Randall E. Johnson, Austin, TX (US);
Dung T. Duong, Cedar Park, TX (US);
Paul N. Winberg, Rollingwood, TX (US)

(73) Assignee: Illumitex, Inc., Austin, TX (US)

( * ) Notice: Subject to any disclaimer, the term of this patent is extended or adjusted under 35 U.S.C. 154(b) by 343 days.

(21) Appl. No.: 12/646,570

(22) Filed: Dec. 23, 2009

(65) Prior Publication Data

US 2011/0044022 A1    Feb. 24, 2011

Related U.S. Application Data

(60) Provisional application No. 61/235,491, filed on Aug. 20, 2009.

(51) Int. Cl.
*F21V 33/00* (2006.01)

(52) U.S. Cl.
USPC ............................................. 362/84

(58) Field of Classification Search
USPC ............................................. 362/84
See application file for complete search history.

(56) References Cited

U.S. PATENT DOCUMENTS

| | | |
|---|---|---|
| 1,670,837 A | 5/1828 | Blackmore |
| 3,981,023 A | 9/1976 | King |
| 3,988,633 A | 10/1976 | Shurgan et al. |
| 4,125,890 A | 11/1978 | Nixon, Jr. |
| 4,180,755 A | 12/1979 | Nixon, Jr. |
| 4,239,369 A | 12/1980 | English et al. |
| 4,304,479 A | 12/1981 | Van Allen |
| 4,388,633 A | 6/1983 | Vasudev |
| 4,439,910 A | 4/1984 | Vasudev |
| 4,486,364 A | 12/1984 | Takahashi |
| 4,501,637 A | 2/1985 | Mitchell et al. |
| 4,716,507 A | 12/1987 | Ames |
| 4,728,999 A | 3/1988 | Dannatt et al. |
| 4,740,259 A | 4/1988 | Heinen |
| 4,799,136 A | 1/1989 | Molnar |

(Continued)

FOREIGN PATENT DOCUMENTS

| | | |
|---|---|---|
| EP | 0534843 A1 | 3/1993 |
| EP | 1 380 469 A2 | 1/2004 |

(Continued)

OTHER PUBLICATIONS

Office Action for U.S. Appl. No. 12/795,484, mailed Jan. 5, 2012, 39 pgs.

(Continued)

*Primary Examiner* — Laura Tso
(74) *Attorney, Agent, or Firm* — Sprinkle IP Law Group

(57) ABSTRACT

Embodiments disclosed herein provide optical systems utilizing photon conversion materials in conjunction with a light source and an LED. An LED can be positioned in a cavity defined by a base and one or more sidewalls. Phosphors can be disposed on the entrance face of a lens between the entrance face to the lens body and the LED so that light emitted from the LED will be incident on the phosphor and down converted before entering the lens body through the entrance face. The lens can positioned so that the phosphors are separated from the LED by a gap.

16 Claims, 19 Drawing Sheets

U.S. PATENT DOCUMENTS

| | | | |
|---|---|---|---|
| 4,841,344 A | 6/1989 | Heinen | |
| 4,966,862 A | 10/1990 | Edmond | |
| 5,036,339 A | 7/1991 | Hediger | |
| 5,087,949 A | 2/1992 | Haitz | |
| 5,114,513 A | 5/1992 | Hosokawa | |
| 5,126,929 A | 6/1992 | Cheselske | |
| 5,151,718 A | 9/1992 | Nelson | |
| 5,174,649 A | 12/1992 | Alston | |
| 5,218,216 A | 6/1993 | Manabe et al. | |
| 5,233,204 A | 8/1993 | Fletcher et al. | |
| 5,251,117 A | 10/1993 | Nagai | |
| 5,272,108 A | 12/1993 | Kozawa et al. | |
| 5,278,433 A | 1/1994 | Manabe et al. | |
| 5,281,830 A | 1/1994 | Kotaki et al. | |
| 5,315,490 A | 5/1994 | Bastable | |
| 5,369,289 A | 11/1994 | Tamaki et al. | |
| 5,523,591 A | 6/1996 | Fleming et al. | |
| 5,528,720 A | 6/1996 | Winston | |
| 5,563,422 A | 10/1996 | Nakamura et al. | |
| 5,578,156 A | 11/1996 | Kamakura et al. | |
| 5,587,593 A | 12/1996 | Koide et al. | |
| 5,620,557 A | 4/1997 | Manabe et al. | |
| 5,652,438 A | 7/1997 | Sassa et al. | |
| 5,654,831 A | 8/1997 | Byren et al. | |
| 5,667,297 A | 9/1997 | Maassen | |
| 5,700,713 A | 12/1997 | Yamazaki et al. | |
| 5,739,554 A | 4/1998 | Edmond et al. | |
| 5,780,867 A | 7/1998 | Fritz et al. | |
| 5,790,583 A | 8/1998 | Ho | |
| 5,813,753 A | 9/1998 | Vriens et al. | |
| 5,839,424 A | 11/1998 | Hauser | |
| 5,846,844 A | 12/1998 | Akasaki et al. | |
| 5,862,167 A | 1/1999 | Sassa et al. | |
| 5,912,477 A | 6/1999 | Negley | |
| 5,945,689 A | 8/1999 | Koike et al. | |
| 5,953,469 A | 9/1999 | Zhou | |
| 5,959,401 A | 9/1999 | Asami et al. | |
| 5,998,925 A | 12/1999 | Shimizu et al. | |
| 6,005,722 A | 12/1999 | Butterworth et al. | |
| 6,008,539 A | 12/1999 | Shibata et al. | |
| 6,023,076 A | 2/2000 | Shibata | |
| 6,066,861 A | 5/2000 | Hohn et al. | |
| 6,078,064 A | 6/2000 | Ming-Jiunn et al. | |
| 6,093,941 A | 7/2000 | Russell | |
| 6,118,908 A | 9/2000 | Bischel | |
| 6,133,589 A | 10/2000 | Krames | |
| 6,144,536 A | 11/2000 | Zimmerman | |
| 6,169,294 B1 | 1/2001 | Biing-Jye et al. | |
| 6,177,761 B1 | 1/2001 | Pelka et al. | |
| 6,185,051 B1 | 2/2001 | Chen et al. | |
| 6,194,742 B1 | 2/2001 | Kern et al. | |
| 6,201,262 B1 | 3/2001 | Edmond et al. | |
| 6,221,683 B1 | 4/2001 | Nirsche et al. | |
| 6,222,207 B1 | 4/2001 | Carter-Coman et al. | |
| 6,229,160 B1 | 5/2001 | Krames | |
| 6,229,782 B1 | 5/2001 | Wang et al. | |
| 6,257,737 B1 | 7/2001 | Marshall et al. | |
| 6,258,618 B1 | 7/2001 | Lester | |
| 6,271,622 B1 | 8/2001 | Coushaine et al. | |
| 6,274,924 B1 | 8/2001 | Carey et al. | |
| 6,287,947 B1 | 9/2001 | Ludowise et al. | |
| 6,307,218 B1 | 10/2001 | Steigerwald et al. | |
| 6,310,364 B1 | 10/2001 | Uemura | |
| 6,323,063 B2 | 11/2001 | Krames | |
| 6,331,450 B1 | 12/2001 | Uemura | |
| 6,335,999 B1 | 1/2002 | Winston | |
| 6,337,493 B1 | 1/2002 | Tanizawa et al. | |
| D453,745 S | 2/2002 | Suenaga | |
| 6,350,041 B1 | 2/2002 | Tarsa et al. | |
| 6,351,069 B1 | 2/2002 | Lowery et al. | |
| 6,356,700 B1 | 3/2002 | Strobl | |
| 6,361,192 B1 | 3/2002 | Fussell et al. | |
| 6,364,487 B1 | 4/2002 | Weber et al. | |
| 6,377,535 B1 | 4/2002 | Chen et al. | |
| 6,410,942 B1 | 6/2002 | Thibeault | |
| 6,417,019 B1 | 7/2002 | Mueller et al. | |
| 6,443,594 B1 | 9/2002 | Marshall et al. | |
| 6,445,011 B1 | 9/2002 | Hirano et al. | |
| 6,452,214 B2 | 9/2002 | Kaneyama et al. | |
| 6,459,100 B1 | 10/2002 | Doverspike et al. | |
| 6,478,453 B2 | 11/2002 | Lammers et al. | |
| 6,486,499 B1 | 11/2002 | Krames et al. | |
| 6,489,636 B1 | 12/2002 | Goetz et al. | |
| 6,501,102 B2 | 12/2002 | Mueller-Mach et al. | |
| 6,502,956 B1 | 1/2003 | Wu | |
| 6,504,171 B1 | 1/2003 | Grillot et al. | |
| 6,504,179 B1 | 1/2003 | Ellens et al. | |
| 6,514,782 B1 | 2/2003 | Wierer, Jr. et al. | |
| 6,515,313 B1 | 2/2003 | Ibbetson et al. | |
| 6,526,082 B1 | 2/2003 | Corzine et al. | |
| 6,526,201 B1 | 2/2003 | Mrakovich et al. | |
| 6,527,411 B1 | 3/2003 | Sayers | |
| 6,534,797 B1 | 3/2003 | Edmond et al. | |
| 6,541,800 B2 | 4/2003 | Barnett et al. | |
| 6,547,416 B2 | 4/2003 | Pashley et al. | |
| 6,547,423 B2 | 4/2003 | Marshall | |
| 6,563,142 B2 | 5/2003 | Shen et al. | |
| 6,570,190 B2 | 5/2003 | Krames | |
| 6,573,537 B1 | 6/2003 | Steigerwald et al. | |
| 6,576,488 B2 | 6/2003 | Collins, III et al. | |
| 6,576,932 B2 | 6/2003 | Khare et al. | |
| D477,579 S | 7/2003 | Suenaga | |
| D477,580 S | 7/2003 | Kamada | |
| 6,598,998 B2 | 7/2003 | West | |
| D478,877 S | 8/2003 | Hoshiba | |
| 6,603,243 B2 | 8/2003 | Parkyn et al. | |
| 6,603,258 B1 | 8/2003 | Mueller-Mach et al. | |
| 6,608,330 B1 | 8/2003 | Yamada | |
| 6,610,598 B2 | 8/2003 | Chen | |
| 6,620,643 B1 | 9/2003 | Koike et al. | |
| 6,623,142 B1 | 9/2003 | Lippmann et al. | |
| 6,630,689 B2 | 10/2003 | Bhat et al. | |
| 6,630,691 B1 | 10/2003 | Mueller-Mach et al. | |
| 6,630,692 B2 | 10/2003 | Goetz et al. | |
| 6,635,503 B2 | 10/2003 | Andrews et al. | |
| 6,635,904 B2 | 10/2003 | Goetz et al. | |
| 6,637,921 B2 | 10/2003 | Coushaine | |
| 6,639,733 B2 | 10/2003 | Minano | |
| D482,337 S | 11/2003 | Kamada | |
| D482,666 S | 11/2003 | Kamada | |
| 6,642,618 B2 | 11/2003 | Yagi et al. | |
| 6,642,652 B2 | 11/2003 | Collins, III et al. | |
| 6,649,440 B1 | 11/2003 | Krames et al. | |
| 6,649,943 B2 | 11/2003 | Shibata et al. | |
| 6,649,946 B2 | 11/2003 | Bogner et al. | |
| 6,650,044 B1 | 11/2003 | Lowery | |
| 6,657,236 B1 | 12/2003 | Thibeault | |
| 6,657,300 B2 | 12/2003 | Goetz et al. | |
| 6,664,560 B2 | 12/2003 | Emerson et al. | |
| 6,671,452 B2 | 12/2003 | Winston | |
| 6,679,621 B2 | 1/2004 | West et al. | |
| 6,680,490 B2 | 1/2004 | Yasukawa et al. | |
| 6,680,569 B2 | 1/2004 | Mueller-Mach et al. | |
| 6,682,207 B2 | 1/2004 | Weber et al. | |
| 6,682,331 B1 | 1/2004 | Peh | |
| 6,683,327 B2 | 1/2004 | Krames et al. | |
| 6,686,691 B1 | 2/2004 | Mueller et al. | |
| 6,696,703 B2 | 2/2004 | Mueller-Mach et al. | |
| 6,711,200 B1 | 3/2004 | Scherer | |
| 6,717,353 B1 | 4/2004 | Mueller et al. | |
| 6,717,355 B2 | 4/2004 | Takahashi et al. | |
| D489,690 S | 5/2004 | Ishida | |
| D490,387 S | 5/2004 | Yagi | |
| 6,730,939 B2 | 5/2004 | Eisert et al. | |
| 6,730,940 B2 | 5/2004 | Steranka | |
| 6,734,467 B2 | 5/2004 | Schlereth et al. | |
| 6,737,681 B2 | 5/2004 | Koda | |
| 6,738,175 B2 | 5/2004 | Morita et al. | |
| 6,740,906 B2 | 5/2004 | Slater, Jr. et al. | |
| D490,782 S | 6/2004 | Suenaga | |
| D490,784 S | 6/2004 | Ishida | |
| D491,538 S | 6/2004 | Ishida | |
| D491,899 S | 6/2004 | Yagi | |
| 6,744,071 B2 | 6/2004 | Sano et al. | |
| 6,744,077 B2 | 6/2004 | Trottier et al. | |
| 6,746,124 B2 | 6/2004 | Fischer et al. | |
| 6,746,295 B2 | 6/2004 | Sorg | |

| Patent | Date | Inventor |
|---|---|---|
| 6,747,298 B2 | 6/2004 | Slater, Jr. et al. |
| 6,759,803 B2 | 7/2004 | Sorg |
| 6,764,932 B2 | 7/2004 | Kong et al. |
| 6,768,136 B2 | 7/2004 | Eisert et al. |
| 6,768,525 B2 | 7/2004 | Paolini |
| 6,774,405 B2 | 8/2004 | Yasukawa et al. |
| 6,777,871 B2 | 8/2004 | Duggal |
| 6,784,027 B2 | 8/2004 | Streubel et al. |
| D495,822 S | 9/2004 | Yoneda |
| D496,007 S | 9/2004 | Hoshiba |
| 6,791,103 B2 | 9/2004 | Nakamura et al. |
| 6,791,116 B2 | 9/2004 | Takahashi et al. |
| 6,791,119 B2 | 9/2004 | Slater |
| 6,794,211 B2 | 9/2004 | Oh |
| 6,794,684 B2 | 9/2004 | Slater, Jr. et al. |
| 6,794,690 B2 | 9/2004 | Uemura |
| D497,349 S | 10/2004 | Hoshiba |
| 6,800,500 B2 | 10/2004 | Coman |
| 6,800,876 B2 | 10/2004 | Edmond et al. |
| 6,806,571 B2 | 10/2004 | Shibata et al. |
| 6,812,053 B1 | 11/2004 | Kong et al. |
| 6,812,500 B2 | 11/2004 | Reeh et al. |
| 6,814,470 B2 | 11/2004 | Rizkin et al. |
| 6,819,505 B1 | 11/2004 | Cassarly |
| 6,819,506 B1 | 11/2004 | Taylor |
| 6,821,804 B2 | 11/2004 | Thibeault et al. |
| 6,825,501 B2 | 11/2004 | Edmond et al. |
| D499,384 S | 12/2004 | Kamada |
| D499,385 S | 12/2004 | Ishida |
| 6,828,596 B2 | 12/2004 | Steigerwald et al. |
| 6,828,599 B2 | 12/2004 | Kim |
| 6,831,302 B2 | 12/2004 | Erchak |
| 6,831,305 B2 | 12/2004 | Yasukawa et al. |
| 6,833,564 B2 | 12/2004 | Shen et al. |
| 6,835,957 B2 | 12/2004 | Stockman |
| 6,838,705 B1 | 1/2005 | Tanizawa et al. |
| 6,841,931 B2 | 1/2005 | Takahashi et al. |
| 6,844,565 B2 | 1/2005 | Lell et al. |
| 6,844,903 B2 | 1/2005 | Mueller-Mach et al. |
| 6,846,101 B2 | 1/2005 | Coushaine |
| 6,847,057 B1 | 1/2005 | Gardner et al. |
| 6,850,002 B2 | 2/2005 | Danielson et al. |
| 6,853,010 B2 | 2/2005 | Slater |
| D502,449 S | 3/2005 | Ishida |
| D503,388 S | 3/2005 | Ishida |
| 6,870,191 B2 | 3/2005 | Niki et al. |
| 6,870,311 B2 | 3/2005 | Mueller et al. |
| 6,871,982 B2 | 3/2005 | Holman |
| 6,872,986 B2 | 3/2005 | Fukuda et al. |
| 6,876,008 B2 | 4/2005 | Bhat et al. |
| 6,876,009 B2 | 4/2005 | Narukawa et al. |
| 6,877,558 B2 | 4/2005 | Connell et al. |
| 6,878,973 B2 | 4/2005 | Lowery et al. |
| 6,885,033 B2 | 4/2005 | Andrews |
| 6,885,036 B2 | 4/2005 | Tarsa |
| 6,888,997 B2 | 5/2005 | Duong |
| 6,890,085 B2 | 5/2005 | Hacker |
| 6,891,199 B2 | 5/2005 | Baur et al. |
| 6,896,381 B2 | 5/2005 | Benitez |
| 6,897,488 B2 | 5/2005 | Baur et al. |
| 6,897,490 B2 | 5/2005 | Brunner et al. |
| 6,900,472 B2 | 5/2005 | Kondoh et al. |
| 6,900,474 B2 | 5/2005 | Misra et al. |
| D506,449 S | 6/2005 | Hoshiba |
| 6,903,376 B2 | 6/2005 | Shen et al. |
| 6,906,352 B2 | 6/2005 | Edmond et al. |
| 6,911,676 B2 | 6/2005 | Yoo |
| 6,916,748 B2 | 7/2005 | Huang |
| 6,917,059 B2 | 7/2005 | Uemura |
| 6,921,928 B2 | 7/2005 | Sonobe |
| 6,924,514 B2 | 8/2005 | Suenaga |
| 6,924,596 B2 | 8/2005 | Sato et al. |
| 6,925,100 B2 | 8/2005 | Senda et al. |
| 6,936,859 B1 | 8/2005 | Uemura et al. |
| 6,936,860 B2 | 8/2005 | Sung et al. |
| 6,943,128 B2 | 9/2005 | Chiyo et al. |
| 6,943,380 B2 | 9/2005 | Ota et al. |
| 6,943,381 B2 | 9/2005 | Gardner et al. |
| 6,943,433 B2 | 9/2005 | Kamada |
| 6,946,682 B2 | 9/2005 | Slater, Jr. et al. |
| 6,946,685 B1 | 9/2005 | Steigerwald et al. |
| D510,913 S | 10/2005 | Sumitani |
| 6,952,024 B2 | 10/2005 | Edmond et al. |
| 6,953,952 B2 | 10/2005 | Asakawa |
| 6,955,933 B2 | 10/2005 | Bour et al. |
| 6,956,245 B2 | 10/2005 | Senda et al. |
| 6,956,247 B1 | 10/2005 | Stockman |
| 6,958,497 B2 | 10/2005 | Emerson et al. |
| 6,960,878 B2 | 11/2005 | Sakano et al. |
| 6,967,116 B2 | 11/2005 | Negley |
| 6,969,946 B2 | 11/2005 | Steranka |
| 6,972,438 B2 | 12/2005 | Li |
| 6,977,396 B2 | 12/2005 | Shen et al. |
| 6,987,281 B2 | 1/2006 | Edmond et al. |
| 6,987,287 B2 | 1/2006 | Liu et al. |
| 6,987,613 B2 | 1/2006 | Pocius |
| 6,989,555 B2 | 1/2006 | Goetz et al. |
| 6,992,334 B1 | 1/2006 | Wierer, Jr. et al. |
| 6,993,242 B2 | 1/2006 | Winston |
| 6,995,032 B2 | 2/2006 | Bruhns et al. |
| 6,998,771 B2 | 2/2006 | Debray et al. |
| 7,001,058 B2 | 2/2006 | Inditsky |
| 7,002,291 B2 | 2/2006 | Ellens et al. |
| 7,005,679 B2 | 2/2006 | Tarsa et al. |
| 7,005,681 B2 | 2/2006 | Bader et al. |
| 7,005,684 B2 | 2/2006 | Uemura et al. |
| 7,009,008 B1 | 3/2006 | Hohn et al. |
| 7,009,199 B2 | 3/2006 | Hall |
| 7,009,213 B2 | 3/2006 | Camras |
| 7,009,218 B2 | 3/2006 | Sugimoto et al. |
| 7,012,279 B2 | 3/2006 | Wierer, Jr. et al. |
| 7,012,281 B2 | 3/2006 | Tsai et al. |
| 7,015,054 B2 | 3/2006 | Steigerwald et al. |
| 7,015,513 B2 | 3/2006 | Hsieh |
| 7,015,516 B2 | 3/2006 | Eliashevich |
| 7,018,915 B2 | 3/2006 | Shibata et al. |
| 7,021,797 B2 | 4/2006 | Minano |
| 7,026,653 B2 | 4/2006 | Sun |
| 7,029,935 B2 | 4/2006 | Negley et al. |
| 7,029,939 B2 | 4/2006 | Chiyo et al. |
| 7,030,423 B2 | 4/2006 | Chang et al. |
| 7,037,741 B2 | 5/2006 | Tasi et al. |
| 7,038,246 B2 | 5/2006 | Uemura |
| 7,038,370 B2 | 5/2006 | Mueller-Mach et al. |
| 7,040,774 B2 | 5/2006 | Beeson |
| 7,042,012 B2 | 5/2006 | Senda et al. |
| 7,042,153 B2 | 5/2006 | Uemura |
| 7,045,956 B2 | 5/2006 | Braune et al. |
| 7,053,417 B2 | 5/2006 | Kim |
| 7,053,419 B1 | 5/2006 | Camras |
| 7,063,807 B2 | 6/2006 | Kummer et al. |
| 7,064,353 B2 | 6/2006 | Bhat |
| 7,064,355 B2 | 6/2006 | Camras |
| 7,064,480 B2 | 6/2006 | Bokor et al. |
| 7,070,300 B2 | 7/2006 | Harbers et al. |
| 7,071,494 B2 | 7/2006 | Steigerwald |
| 7,071,495 B2 | 7/2006 | Uemura |
| 7,072,096 B2 | 7/2006 | Holman |
| 7,074,631 B2 | 7/2006 | Erchak |
| 7,075,610 B2 | 7/2006 | Scalora |
| 7,078,254 B2 | 7/2006 | Loh |
| 7,078,732 B1 | 7/2006 | Reeh et al. |
| 7,078,738 B2 | 7/2006 | Nawashiro et al. |
| 7,080,932 B2 | 7/2006 | Keuper |
| 7,083,993 B2 | 8/2006 | Erchak |
| 7,087,738 B2 | 8/2006 | Botstein et al. |
| 7,087,931 B2 | 8/2006 | Wu et al. |
| 7,087,936 B2 | 8/2006 | Negley |
| 7,091,656 B2 | 8/2006 | Murazaki et al. |
| 7,095,765 B2 | 8/2006 | Liu et al. |
| 7,098,588 B2 | 8/2006 | Jager et al. |
| 7,105,857 B2 | 9/2006 | Nagahama et al. |
| 7,106,090 B2 | 9/2006 | Harle et al. |
| 7,108,386 B2 | 9/2006 | Jacobson |
| 7,109,521 B2 | 9/2006 | Hallin |
| 7,109,529 B2 | 9/2006 | Uemura et al. |
| 7,111,964 B2 | 9/2006 | Suehiro et al. |
| 7,112,636 B2 | 9/2006 | Okada |

| | | | |
|---|---|---|---|
| 7,122,839 B2 | 10/2006 | Shen et al. |
| 7,132,695 B2 | 11/2006 | Ou et al. |
| 7,132,786 B1 | 11/2006 | Debray et al. |
| 7,138,662 B2 | 11/2006 | Uemura |
| 7,153,015 B2 | 12/2006 | Brukilacchio |
| 7,154,121 B2 | 12/2006 | Hsieh et al. |
| 7,154,149 B2 | 12/2006 | Wu et al. |
| D534,505 S | 1/2007 | Kamada |
| 7,157,294 B2 | 1/2007 | Uemura et al. |
| 7,161,187 B2 | 1/2007 | Suehiro et al. |
| 7,161,301 B2 | 1/2007 | Hsieh et al. |
| 7,170,097 B2 | 1/2007 | Edmond et al. |
| D536,672 S | 2/2007 | Asakawa |
| D537,047 S | 2/2007 | Asakawa |
| 7,183,586 B2 | 2/2007 | Ichihara et al. |
| 7,183,632 B2 | 2/2007 | Arndt et al. |
| 7,183,661 B2 | 2/2007 | Bogner et al. |
| 7,192,797 B2 | 3/2007 | Tu et al. |
| 7,193,299 B2 | 3/2007 | Arndt et al. |
| 7,196,359 B2 | 3/2007 | Baur et al. |
| 7,201,495 B2 | 4/2007 | Epstein |
| 7,202,181 B2 | 4/2007 | Negley |
| 7,211,832 B2 | 5/2007 | Hirose |
| 7,211,833 B2 | 5/2007 | Slater, Jr. et al. |
| 7,211,835 B2 | 5/2007 | Ono |
| 7,215,074 B2 | 5/2007 | Shimizu et al. |
| 7,217,583 B2 | 5/2007 | Negley et al. |
| 7,227,190 B2 | 6/2007 | Yasukawa et al. |
| 7,227,191 B2 | 6/2007 | Eberhard et al. |
| D547,736 S | 7/2007 | Kamada |
| 7,244,968 B2 | 7/2007 | Yoo |
| 7,247,257 B2 | 7/2007 | Murazaki et al. |
| 7,247,884 B2 | 7/2007 | Shibata et al. |
| 7,247,940 B2 | 7/2007 | Hofer et al. |
| 7,250,715 B2 | 7/2007 | Mueller et al. |
| 7,253,450 B2 | 8/2007 | Senda et al. |
| 7,253,451 B2 | 8/2007 | Yoo et al. |
| 7,256,428 B2 | 8/2007 | Braune et al. |
| 7,256,468 B2 | 8/2007 | Suenaga |
| 7,256,483 B2 | 8/2007 | Epler et al. |
| 7,258,816 B2 | 8/2007 | Tamaki et al. |
| 7,259,033 B2 | 8/2007 | Slater, Jr. et al. |
| 7,259,402 B2 | 8/2007 | Edmond et al. |
| 7,264,527 B2 | 9/2007 | Bawendi et al. |
| 7,265,392 B2 | 9/2007 | Hahn et al. |
| 7,268,371 B2 | 9/2007 | Krames et al. |
| 7,274,040 B2 | 9/2007 | Sun |
| 7,276,737 B2 | 10/2007 | Camras et al. |
| 7,279,346 B2 | 10/2007 | Andrews et al. |
| 7,279,723 B2 | 10/2007 | Matsumura et al. |
| 7,279,724 B2 | 10/2007 | Collins, III et al. |
| 7,280,288 B2 | 10/2007 | Loh et al. |
| 7,282,744 B2 | 10/2007 | Flynn et al. |
| 7,288,797 B2 | 10/2007 | Deguchi et al. |
| 7,291,529 B2 | 11/2007 | Slater, Jr. et al. |
| 7,291,865 B2 | 11/2007 | Kojima et al. |
| 7,294,866 B2 | 11/2007 | Liu |
| D557,224 S | 12/2007 | Kamada |
| 7,319,247 B2 | 1/2008 | Bader et al. |
| 7,319,289 B2 | 1/2008 | Suehiro et al. |
| 7,326,583 B2 | 2/2008 | Andrews et al. |
| 7,326,967 B2 | 2/2008 | Hsieh et al. |
| 7,329,587 B2 | 2/2008 | Bruederl et al. |
| 7,329,905 B2 | 2/2008 | Ibbetson et al. |
| 7,332,365 B2 | 2/2008 | Nakamura et al. |
| 7,335,522 B2 | 2/2008 | Wang et al. |
| 7,335,920 B2 | 2/2008 | Denbaars et al. |
| 7,338,822 B2 | 3/2008 | Wu et al. |
| 7,341,878 B2 | 3/2008 | Krames et al. |
| 7,344,902 B2 | 3/2008 | Basin et al. |
| 7,345,297 B2 | 3/2008 | Yamazoe et al. |
| 7,345,313 B2 | 3/2008 | Strauss et al. |
| 7,345,413 B2 | 3/2008 | Braune et al. |
| 7,348,600 B2 | 3/2008 | Narukawa et al. |
| D565,516 S | 4/2008 | Kamada |
| 7,351,356 B2 | 4/2008 | Delsing et al. |
| 7,352,011 B2 | 4/2008 | Smits et al. |
| 7,355,209 B2 | 4/2008 | Tsai et al. |
| 7,355,210 B2 | 4/2008 | Ou et al. |
| 7,355,284 B2 | 4/2008 | Negley |
| 7,358,522 B2 | 4/2008 | Yanamoto |
| 7,358,540 B2 | 4/2008 | Hsieh et al. |
| 7,361,938 B2 | 4/2008 | Mueller et al. |
| 7,365,369 B2 | 4/2008 | Nakamura et al. |
| 7,365,371 B2 | 4/2008 | Andrews |
| 7,368,329 B2 | 5/2008 | Waitl et al. |
| 7,372,198 B2 | 5/2008 | Negley |
| 7,375,377 B2 | 5/2008 | Baur et al. |
| D571,738 S | 6/2008 | Wall, Jr. |
| 7,382,033 B2 | 6/2008 | Roth et al. |
| 7,384,809 B2 | 6/2008 | Donofrio |
| 7,385,226 B2 | 6/2008 | Ou et al. |
| 7,387,677 B2 | 6/2008 | Dwilinski et al. |
| 7,388,232 B2 | 6/2008 | Suehiro et al. |
| 7,390,684 B2 | 6/2008 | Izuno et al. |
| D572,209 S | 7/2008 | Tokuda |
| 7,393,122 B2 | 7/2008 | Tsuzuki et al. |
| 7,393,213 B2 | 7/2008 | Yoo et al. |
| 7,402,837 B2 | 7/2008 | Slater, Jr. et al. |
| 7,402,840 B2 | 7/2008 | Krames et al. |
| 7,405,093 B2 | 7/2008 | Andrews |
| 7,414,269 B2 | 8/2008 | Grotsch et al. |
| 7,419,839 B2 | 9/2008 | Camras et al. |
| 7,429,750 B2 | 9/2008 | Suehiro et al. |
| 7,429,758 B2 | 9/2008 | Ruhnau et al. |
| D578,226 S | 10/2008 | West et al. |
| 7,432,534 B2 | 10/2008 | Yoo et al. |
| 7,432,536 B2 | 10/2008 | Slater, Jr. et al. |
| 7,432,589 B2 | 10/2008 | Yamamoto et al. |
| 7,432,642 B2 | 10/2008 | Murazaki |
| 7,432,647 B2 | 10/2008 | Nagatomi et al. |
| 7,436,002 B2 | 10/2008 | Brunner et al. |
| 7,436,066 B2 | 10/2008 | Sonobe et al. |
| 7,439,091 B2 | 10/2008 | Chen et al. |
| 7,439,609 B2 | 10/2008 | Negley |
| 7,442,254 B2 | 10/2008 | Kiyoku et al. |
| 7,442,644 B2 | 10/2008 | Nogami |
| 7,442,966 B2 | 10/2008 | Bader et al. |
| D580,380 S | 11/2008 | Tokuda |
| 7,445,354 B2 | 11/2008 | Aoki et al. |
| 7,446,343 B2 | 11/2008 | Mueller et al. |
| 7,446,344 B2 | 11/2008 | Fehrer et al. |
| 7,446,345 B2 | 11/2008 | Emerson et al. |
| 7,446,346 B2 | 11/2008 | Harle |
| 7,452,737 B2 | 11/2008 | Basin et al. |
| 7,456,499 B2 | 11/2008 | Loh et al. |
| D582,865 S | 12/2008 | Edmond et al. |
| D582,866 S | 12/2008 | Edmond et al. |
| 7,462,861 B2 | 12/2008 | Slater, Jr. et al. |
| 7,473,933 B2 | 1/2009 | Yan |
| 7,772,604 B2 | 8/2010 | Duong et al. |
| 7,789,531 B2 | 9/2010 | Duong et al. |
| 7,829,358 B2 | 11/2010 | Duong et al. |
| 7,968,896 B2 | 6/2011 | Duong et al. |
| 8,087,960 B2 | 1/2012 | Duong et al. |
| 8,263,993 B2 | 9/2012 | Duong et al. |
| 2002/0012247 A1 | 1/2002 | Kamiya et al. |
| 2002/0017844 A1 | 2/2002 | Parkyn et al. |
| 2002/0030194 A1 | 3/2002 | Camras et al. |
| 2002/0080615 A1 | 6/2002 | Marshall et al. |
| 2002/0080622 A1 | 6/2002 | Pashley et al. |
| 2002/0123164 A1 | 9/2002 | Slater et al. |
| 2002/0127864 A1 | 9/2002 | Smith et al. |
| 2002/0141006 A1 | 10/2002 | Pocius et al. |
| 2002/0163808 A1 | 11/2002 | West et al. |
| 2003/0002272 A1 | 1/2003 | Suehiro et al. |
| 2003/0036217 A1 | 2/2003 | Richard |
| 2003/0089914 A1 | 5/2003 | Chen |
| 2003/0132447 A1 | 7/2003 | Yukimoto |
| 2003/0156416 A1 | 8/2003 | Stopa et al. |
| 2004/0016718 A1 | 1/2004 | Hwu et al. |
| 2004/0036080 A1 | 2/2004 | Bogner et al. |
| 2004/0046489 A1 | 3/2004 | Vetorino et al. |
| 2004/0079957 A1 | 4/2004 | Andrews et al. |
| 2004/0114393 A1 | 6/2004 | Galli |
| 2004/0120153 A1 | 6/2004 | Pate |
| 2004/0126913 A1 | 7/2004 | Loh |
| 2004/0155565 A1 | 8/2004 | Holder et al. |

| | | | |
|---|---|---|---|
| 2004/0201987 | A1 | 10/2004 | Omata |
| 2004/0207774 | A1 | 10/2004 | Gothard |
| 2004/0218390 | A1 | 11/2004 | Holman et al. |
| 2004/0222426 | A1 | 11/2004 | Hsiung |
| 2004/0232825 | A1 | 11/2004 | Sorg |
| 2004/0233665 | A1 | 11/2004 | West et al. |
| 2004/0264185 | A1 | 12/2004 | Grotsch et al. |
| 2005/0001230 | A1 | 1/2005 | Takekuma |
| 2005/0006651 | A1 | 1/2005 | LeBoeuf et al. |
| 2005/0007777 | A1 | 1/2005 | Klipstein et al. |
| 2005/0018248 | A1 | 1/2005 | Silverbrook |
| 2005/0024887 | A1 | 2/2005 | Boyler |
| 2005/0047729 | A1 | 3/2005 | Vilgiate |
| 2005/0063181 | A1 | 3/2005 | Chiba et al. |
| 2005/0073840 | A1 | 4/2005 | Chou et al. |
| 2005/0073849 | A1 | 4/2005 | Rhoads et al. |
| 2005/0077529 | A1 | 4/2005 | Shen |
| 2005/0093430 | A1* | 5/2005 | Ibbetson et al. ............. 313/501 |
| 2005/0173719 | A1 | 8/2005 | Yonekubo |
| 2005/0195488 | A1 | 9/2005 | McCabe et al. |
| 2005/0215000 | A1 | 9/2005 | Negley |
| 2006/0046622 | A1 | 3/2006 | Prasad |
| 2006/0094340 | A1 | 5/2006 | Ouderkirk et al. |
| 2006/0108590 | A1 | 5/2006 | Kawaguchi |
| 2006/0192194 | A1 | 8/2006 | Erchak et al. |
| 2007/0063214 | A1* | 3/2007 | Kim et al. ....................... 257/99 |
| 2007/0108459 | A1 | 5/2007 | Lu |
| 2007/0120135 | A1* | 5/2007 | Soules et al. ................... 257/98 |
| 2007/0152230 | A1 | 7/2007 | Duong et al. |
| 2008/0030974 | A1 | 2/2008 | Abug-Ageel |
| 2008/0030993 | A1 | 2/2008 | Narendran et al. |
| 2008/0062672 | A1 | 3/2008 | Peng et al. |
| 2008/0080166 | A1 | 4/2008 | Duong et al. |
| 2008/0081531 | A1 | 4/2008 | Duong et al. |
| 2008/0266893 | A1 | 10/2008 | Speier |
| 2009/0085043 | A1 | 4/2009 | Song et al. |
| 2009/0085052 | A1 | 4/2009 | Ko et al. |
| 2009/0087937 | A1 | 4/2009 | Kim |
| 2009/0087994 | A1 | 4/2009 | Lee et al. |
| 2009/0275157 | A1 | 11/2009 | Winberg et al. |
| 2009/0275266 | A1 | 11/2009 | Winberg et al. |
| 2009/0309116 | A1* | 12/2009 | Kato et al. ....................... 257/98 |
| 2011/0273894 | A1 | 11/2011 | Duong et al. |
| 2012/0068615 | A1 | 3/2012 | Duong et al. |

FOREIGN PATENT DOCUMENTS

| | | |
|---|---|---|
| JP | 2000-180962 | 6/2000 |
| JP | 2003-53647 | 2/2003 |
| JP | 2005-109289 | 4/2005 |
| JP | P3900144 | 1/2007 |
| WO | WO2007061638 | 5/2007 |

OTHER PUBLICATIONS

Office Action for U.S. Appl. No. 12/492,472, mailed Jan. 17, 2012, 54 pgs.

Office Action for U.S. Appl. No. 11/906,219 mailed Jan. 18, 2011, 11 pgs.

International Preliminary Report on Patentability for International Application No. PCT/US2009/048787 mailed Jan. 13, 2011, Patent Cooperation Treaty, 7 pgs.

International Preliminary Report on Patentability for International Application No. PCT/US2009/048788 mailed Jan. 13, 2011, Patent Cooperation Treaty, 6 pgs.

International Search Report and Written Opinion, International Patent Application No. PCT/US07/00102 mailed Mar. 28, 2008, 10 pgs.

International Search Report and Written Opinion, International Patent Application No. PCT/US07/21117 mailed Mar. 25, 2008, 10 pgs.

International Preliminary Examination Report, International Application No. PCT/US2007/000102, mailed Jul. 17, 2008, 6 pgs.

Light-Emitting Diode, Wikipedia, Nov. 17, 2008, pp. 1-15, at http://en.wikipedia.org/wiki/Light-emitting_diode.

Cree XLamp LED Reliability, Cree LED Light, Sep. 2007, pp. 1-9, Cree, Inc., Durham, NC 27703, at www.cree.com/xlamp.

Golden DRAGON Engineering Kit, OSRAM Opto Semiconductors GmbH, Oct. 4, 2006, Regensburg, Germany, at www.osram-os.com, 6 pgs.

Power Light Source Luxeon Rebel, Technical Datasheet DS56, Philips, Jul. 2008, Philips Lumileds Lighting Company, US, at www.luxeon.com, 34 pgs.

Specification for NICHIA Chip Type White LED, Model NSSW108T, Cat. No. 070606, NICHIA Corporation, 13 pgs.

Haque, High-power LED Stud-bump Packaging, Advanced Packaging, Apr. 2006, 6 pgs., at http://ap.pennnet.com/Articles/Article_Display.cfm?Section+ARTCL&ARTICLE_ID=252779&VERSI.

Wong et al., Packaging of Power LEDs Using Thermosonic Bonding of Au—Au Interconnects, SMTA Int'l Conf., Sep. 24, 2006, pp. 1-2, SMTA, Edina, MN at www.smta.org.

Moreno, LED Intensity Distribution, International Optical Design Conf. 2006, Jun. 2006, Optical Society of America, ISBN: 1-55752-814-4, 3 pgs.

Moreno et al., Modeling the Radiation Pattern of LEDs, Optics Express, Feb. 4, 2008, vol. 16, No. 3, Optical Society of America #90469, 12 pgs.

Cho et al., Dry etching of GaN and related materials; Comparison of techniques, IEEE Journal of Selected Topics in Quantum Electronics, 1998, 4(3):557-563, 11 pgs.

Mishra, GaN Vacuum Microelectronic Electron Emitter with Integrated Extractor, Santa Barbara CA, Jan. 28, 2009 at my.ece.ucsb.edu/mishra/vacuummicroelec/finalrepnsf.pdf, 4 pgs.

He, GaN layers re-grown on etched GaN templates by plasma assisted molecular beam epitaxy, Mat. Res. Soc. Symp. vol. 798, 2004 Materials Research Society, Richmond, VA, 4 pgs.

Gallium Nitride Film Growth, downloaded Feb. 6, 2009 at www.onr.navy.mil/sci_tech/31/312/ncsr/materials/gan/filmgrowth.asp?css printer&.

The Asymmetric Reflector, Elliptipar, West Haven, CT, 2 pgs., downloaded from http://www.elliptipar.com/reflector.asp on Mar. 27, 2009.

Sports Lighting Solutions, Lighting Information, Abacus Lighting Limited, Nottinghamshire, England, 3 pgs., downloaded from http://www.abacuslighting.com/sportslighting.asp?sport=sn03 on Mar. 27, 2009.

Samsung files patents ahead of LED spin-out, Apr. 2, 2009, downloaded Apr. 14, 2009 at http://compoundsemiconductor.net/cws/article/news/38551, 2 pgs.

International Search Report and Written Opinion, International Patent Application No. PCT/US2009/033429, dated Apr. 15, 2009, 9 pgs.

International Preliminary Report on Patentability, International Patent Application No. PCT/US2007/021117, dated Apr. 7, 2009, 8 pgs.

Office Action issued in U.S. Appl. No. 11/906,194, mailed on Jul. 24, 2009, 6 pgs.

International Search Report and Written Opinion, International Patent Application No. PCT/US09/48788, mailed Aug. 14, 2009, 6 pgs.

International Search Report and Written Opinion, International Patent Application No. PCT/US09/48787, mailed Aug. 14, 2009, 7 pgs.

Office Action issued in U.S. Appl. No. 11/649,018, mailed Sep. 4, 2009, 18 pgs.

International Search Report and Written Opinion, PCT/US09/051962, mailed Sep. 15, 2009, 5 pgs.

Notice of Allowance for U.S. Appl. No. 12/788,094, mailed May 3, 2011, 11 pgs.

Office Action for U.S. Appl. No. 11/906,219, mailed May 24, 2011, 13 pgs.

Office Action issued in U.S. Appl. No. 11/906,219 mailed on May 13, 2010, 13 pgs.

Notice of Allowance for U.S. Appl. No. 11/906,219, mailed Sep. 1, 2011, 8 pgs.

Notice of Allowance for U.S. Appl. No. 11/906,219, mailed Oct. 12, 2010, 6 pgs.

International Search Report and Written Opinion for International Application No. PCT/US2010/046108, mailed Oct. 18, 2010, 7 pgs.

European Search Report and Written Opinion for Application No. EP 07716261, mailed Nov. 30, 2010, 8 pgs.

International Preliminary Report on Patentability for PCT Patent Application No. PCT/US2010/046108, mailed Mar. 1, 2012, 7 pages.

Office Action for Japanese Patent Application No. 2009-531411 with English translation, Japanese Patent Office, mailed Jul. 23, 2012, 10 pgs.

Office Action (with English translation) for Japanese Patent Application No. 2008-549548, mailed Oct. 4, 2012, 13 pgs.

Butsurigaku Jiten (Dictionary of Physics), Third Edition, Baifukan Corp., Sep. 30, 2005, p. 717, 447-448.

Notice of Allowance and Fee(s) Due for U.S. Appl. No. 13/077,594 mailed Apr. 10, 2013. 8 pgs.

* cited by examiner

SYSTEM AND METHOD FOR A LENS AND PHOSPHOR LAYER

RELATED APPLICATIONS

This application claims priority under 35 U.S.C. §119(e) to U.S. Provisional Patent No. 61/235,491, entitled "Phosphor Coated Lens for Phosphor Converting Type White Light Engine", by Ko et al., which is hereby fully incorporated by reference herein.

TECHNICAL FIELD OF THE DISCLOSURE

The present disclosure relates generally to optical systems. More particularly, the present disclosure relates to systems and methods for using phosphors or other photon converting materials in conjunction with a light source and lens.

BACKGROUND OF THE DISCLOSURE

Phosphors are lambertian emitters, emitting light in all directions. In traditional LED implementations, phosphor is applied on the LED chip, in a silicone matrix in proximity to the LED or to the outside of an LED dome or other LED packaging. A dome may be applied to an LED chip coated with phosphor to control the light beam angle (shape) from lambertian to a very narrow spot. Such devices range from hemispherical lenses to T-5 mm (T 1¾) aspheres. One conventional system for producing white light LEDs, for example, is constructed with pump blue/UV LED chips and a proximate mixture of phosphor in a binding matrix such as silicone. The term "goop in a cup" is used to describe LEDs with flat or very nearly flat phosphor and silicone mixture over a blue pump. In remote phosphor systems, phosphor is applied away from the chip on the outside of a dome or inside of a hemispherical shell to increase converting efficiency. However, an additional lens may be needed to control light beam shape. The GE VIO® employs the remote phosphor solution.

Current systems suffer efficiency losses due to heating of the LED chip and the phosphor particles. Additionally, many current system require secondary optics or additional lenses to shape the light emitted from a dome or phosphor coated LED into a desired beam angle. The coupling of a lens to a dome causes efficiency losses of approximately 15%. Furthermore, current systems suffer conversion losses when multiple color phosphors are used due to self absorption. For instance, a red-emitting phosphor may absorb down-converted light from a green-emitting phosphor instead of the pump wavelength, thereby introducing further losses.

The following U.S. Patents describe prior efforts in addressing some of the challenges in phosphor converting light emitting devices. U.S. Pat. No. 6,614,179 discloses a light emitting device with blue light emitting diode and phosphor components. U.S. Pat. Nos. 5,998,925, 6,069,440, and 6,608,332 disclose white light emitting devices, each having a nitride compound semiconductor and a phosphor containing yttrium-aluminum-garnet (YAG) elements. The nitride compound semiconductor is used as a light emitting layer. The phosphor absorbs a part of light emitted by the light emitting layer and emits light of a wavelength different from that of the absorbed light. U.S. Pat. No. 6,737,681 discloses chip placement designs for white light packages. One example includes a fluorescent member having a curved surface or concave arc that extends from the height of the bottom of a case obliquely upward in a shape that continues along substantially the entire circumference of an oval or elongated round shape. It reflects the light emitted from the side faces of a semiconductor light emitting element to more efficiently utilize part of the light emitted from the semiconductor light emitting element and most of the light emitted from the side faces. U.S. Pat. No. 6,924,596 discloses a color conversion type light emitting apparatus having a light emitting device and a color converting member formed from an epoxy resin containing a photoluminescence fluorescent substance and directly coating the light emitting device. U.S. Pat. Nos. 7,091,656 and 7,247,257 disclose light emitting devices that use a mixture of at least two phosphors for more complete color rendering. U.S. Pat. No. 7,071,616 discloses a light source having a blue LED, an optical guide plate having a planar main surface and an edge face receiving injection of the light from the blue LED and a coating material of transparent resin or glass containing fluorescent materials positioned between the blue LED and the optical guide plate. The optical guide plate is used for the final light mixing. U.S. Pat. Nos. 7,026,756, 7,126,274, 7,329,988, 7,362,048 disclose light emitting devices with blue light LED and phosphor components, including the emission spectra and package designs for display backlight. U.S. Pat. No. 6,960,878 discloses an LED chip having a blue die and a phosphor and including an epoxy resin for better reliability and optical stability. U.S. Pat. No. 7,256,468 discloses a light emitting device having a light emitting element and a metal package with a heat radiating characteristic and mechanical strength for housing the light emitting element.

SUMMARY

Embodiments described herein provide optical systems in which phosphor can down convert light prior to the light entering a lens body. One embodiment can include a system comprising an LED, a lens and phosphor disposed on the lens. The LED is positioned in a cavity defined by a base and one or more sidewalls. The phosphors are disposed on the lens between the entrance face to the lens body and the LED so that light emitted from the LED will be incident on the phosphor and down converted before entering the lens body through the entrance face. The lens is positioned so that the phosphors are separated from the LED by a gap. The phosphor can be disposed as a coating on the entrance face of the lens body, on a buffer layer between the phosphor and the entrance face or otherwise disposed on the lens. According to one embodiment, the lens body can be shaped to emit light with a uniform distribution in a desired half-angle. Additionally, the lens body can be shaped to conserve brightness or come within a desired percentage of conserving brightness.

The cavity can have sidewalls that are shaped to direct light in the cavity to the entrance face of the LED. The material forming the cavity sidewalls can be selected to reflect light to the entrance face. In another embodiment, a reflector can surround the LED. The reflector can be a separate component or, according to one embodiment, can be formed by surface tension at the edges of the cavity if the cavity is filled with encapsulant.

Another embodiment of an optical system can comprise a submount, an array of LEDs mounted to the submount, a housing and a set of lenses. The housing can at least partially define a set of LED cavities in cooperation with the submount. The housing can also define a set of lens cavities to accommodate the lenses. Each lens cavity can be open to a corresponding LED cavity. The lenses can be disposed in the lens cavities with each lens comprising an entrance face proximate to the opening to the corresponding LED cavity. A layer of phosphors can disposed on each lens between the entrance face and the corresponding LED so that light is down converted before entering the lens body. The entrance face of each lens is positioned a distance from the corresponding LED so that there is a gap between the LED and the phosphors.

Each lens cavity can be defined by a set of sidewalls. The set of sidewalls can be shaped so that the lens cavity is smaller proximate to the opening to the corresponding LED cavity and larger distal from the opening of the corresponding LED cavity.

Each lens in the set of lenses can be configured to emit light with a uniform distribution pattern in a selected half-angle. The set of lenses can be closely packed so that the optical system emits light in a uniform distribution pattern in the selected half-angle over a larger area than the individual lenses in the set of lenses. Additionally, each lens in the set of lenses can be shaped to conserve brightness.

The system, according to one embodiment, can include a cover that supports one or more lenses in corresponding lens cavities. The cover and one or more lenses can be formed of a single piece of material.

The phosphor layer disposed on each lens can be selected so that different lenses in the set of lenses emit different colors of light. By way of example, but not limitation, the phosphor layer disposed on each lens is selected so that the optical system forms one or more white light units.

One advantage provided by embodiments described herein is that phosphor is removed from the LED chip. Heating of the LED chip is therefore reduced or prevented.

As another advantage, phosphor conversion efficiency can be increased due to the separation of phosphor from the LED active layer. Self-heating of phosphor due to the Stoke's shift can be suppressed by heat dissipation through lens materials and through the system submount/heatsink.

As yet another advantage of some embodiments, higher phosphor conversion efficiency can be achieved due to the low flux density at the entrance of the lens.

As another advantage of various embodiments, positioning phosphor at the entrance surface of a brightness conserving separate optical device can provide an optimal balance between thermal consideration and effective phosphor package efficiencies.

Embodiments described herein also provide for flexible optical system architectures. Because the phosphor coated lens can be separate from the LED chip, it can be used in conjunction with various types of optical devices, including conventional light emitting devices.

As yet another advantage, light beam pattern control and color conversion can be achieved at the same optical device.

Embodiments can provide another advantage by providing a uniform spatial distribution at far field using a brightness conserving lens, making it possible for the underlying optical system to produce an image with the same entendue as the source.

Embodiments of a brightness conserving phosphor lens provide another advantage by allowing for near and/or far field color and spatial uniformity or for near and/or far field tailored color distribution and spatial distribution.

Embodiments disclosed herein can further allow for close packing phosphor coated lenses.

BRIEF DESCRIPTION OF THE DRAWINGS

A more complete understanding of the embodiments and the advantages thereof may be acquired by referring to the following description, taken in conjunction with the accompanying drawings in which like reference numbers indicate like features and wherein.

DETAILED DESCRIPTION

Figure 1:
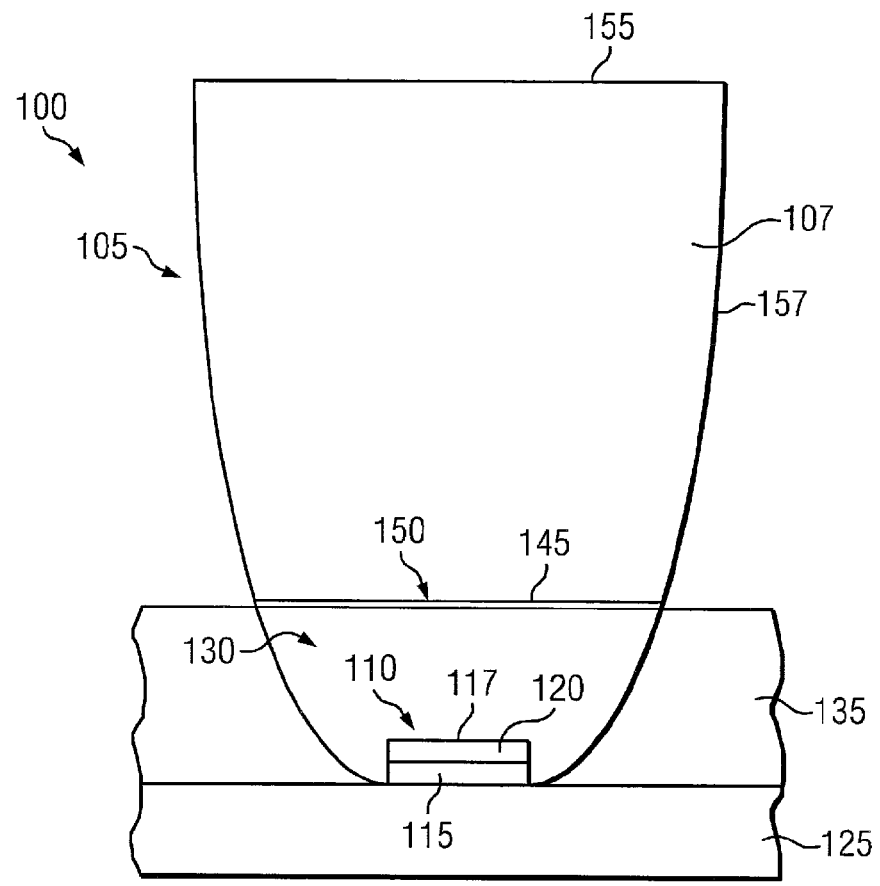
FIGS. 1-4 are diagrammatic representations of embodiments of optical systems.

Embodiments and various features and advantageous details thereof are explained more fully with reference to the exemplary, and therefore non-limiting, examples illustrated in the accompanying drawings and detailed in the following description. Descriptions of known starting materials and processes may be omitted so as not to unnecessarily obscure the disclosure in detail. It should be understood, however, that the detailed description and the specific examples, while indicating the preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, product, article, or apparatus that comprises a list of elements is not necessarily limited only those elements but may include other elements not expressly listed or inherent to such process, product, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, any examples or illustrations given herein are not to be regarded in any way as restrictions on, limits to, or express definitions of, any term or terms with which they are utilized. Instead these examples or illustrations are to be regarded as being described with respect to one particular embodiment and as illustrative only. Those of ordinary skill in the art will appreciate that any term or terms with which these examples or illustrations are utilized encompass other embodiments as well as implementations and adaptations thereof which may or may not be given therewith or elsewhere in the specification and all such embodiments are intended to be included within the scope of that term or terms. Language designating such non-limiting examples and illustrations includes, but is not limited to: "for example," "for instance," "e.g.," "in one embodiment," and the like.

Reference is now made in detail to the exemplary embodiments of the disclosure, examples of which are illustrated in the accompanying drawings. Wherever possible, like numerals will be used throughout the drawings to refer to like and corresponding parts (elements) of the various drawings.

Embodiments described herein provide an optical system that maintains a photon conversion material away from a light source and between the light source and the entrance face of a lens. A light source can be disposed in a cavity having a base and sidewalls. In one embodiment, the cavity can be formed by a housing in cooperation with a submount. A lens can be positioned so that the entrance face of the lens is a selected distance from the light source. A layer of photon converting material can be disposed on the lens between the entrance face of the lens and the light source so that the material converts light emitted from the light source to a different wavelength before the light enters the lens. The photon converting material can be disposed directly on the entrance face to the lens, on a buffer layer or another layer of the lens. In the following examples the light source is an LED and the photon converting material includes phosphors. However, it should be understood that embodiments disclosed herein can be used with other light sources and photon converting materials.

Figure 2:
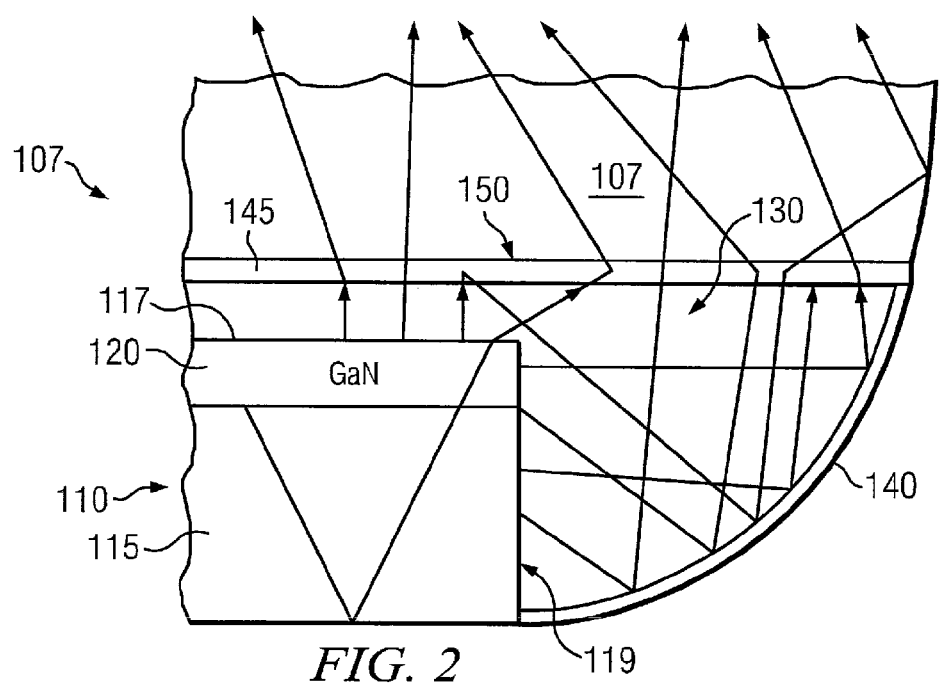
Figure 4:
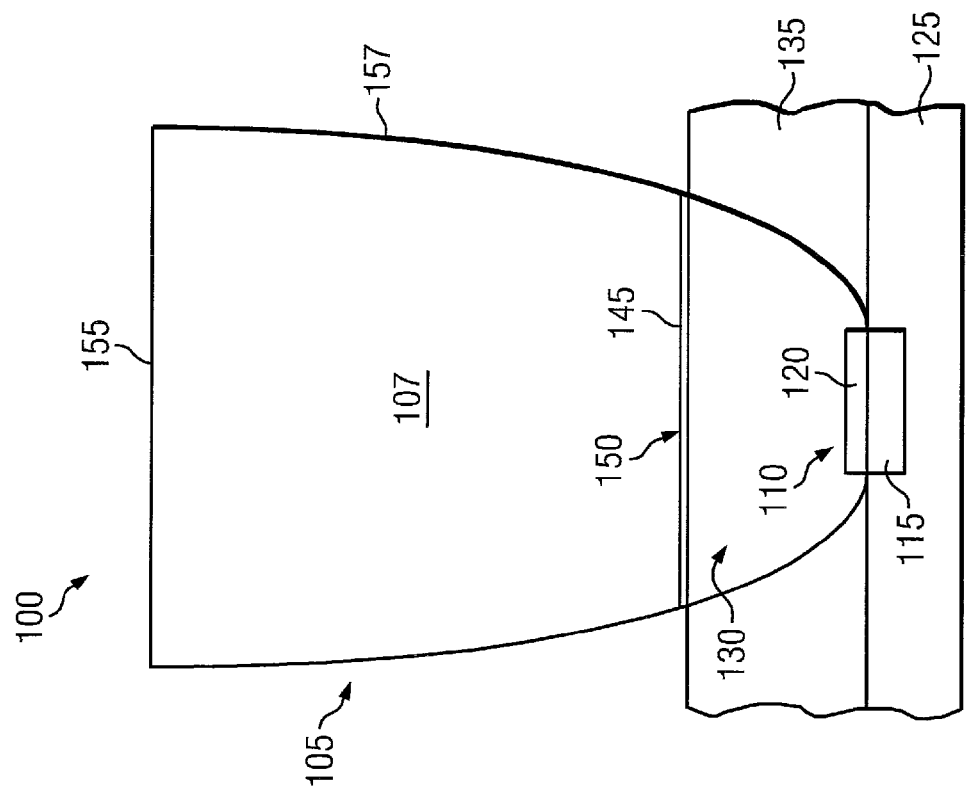
Figure 3:
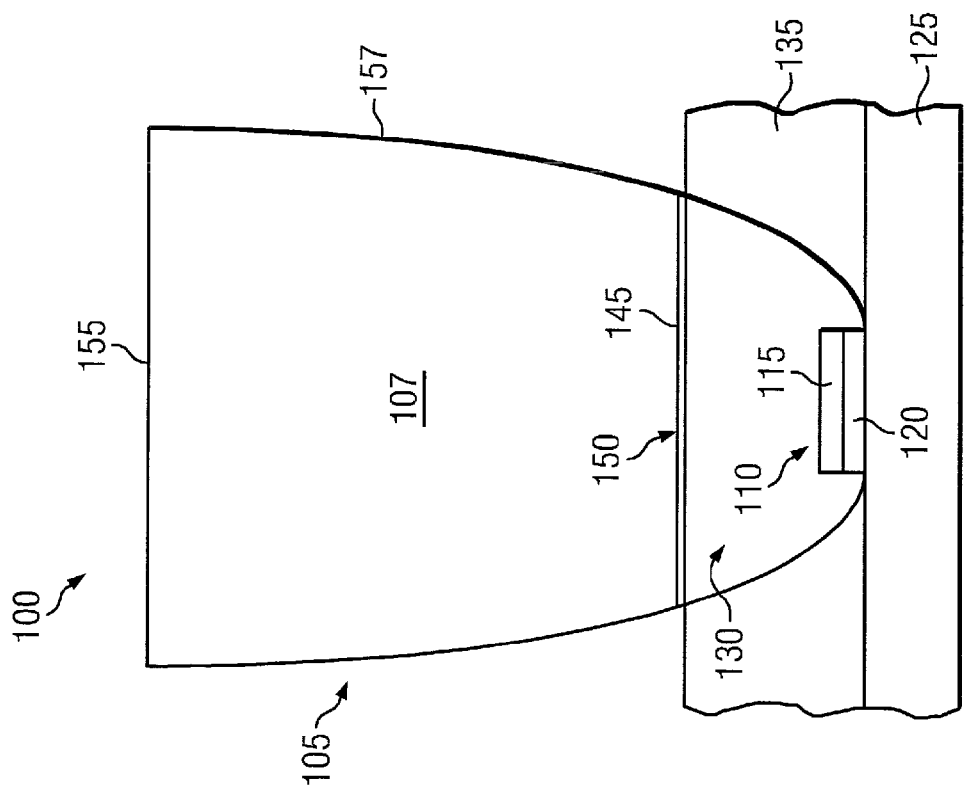

FIGS. 1-4 are diagrammatic representations of optical systems comprising a lens 105 separated by a gap from an LED 110. The LED can be a lateral LED as shown in FIGS. 1 and 2, a flip-chip LED as illustrated in FIG. 3, a vertical LED as illustrated in FIG. 4, or any other suitable type of LED or light source. LED 110 can include a substrate 115 of any suitable LED substrate material including sapphire, silicon carbide, diamond, molded glass or other substrate material. Additionally, LED 110 can have non-substrate layers 120 that can include one or more layers or regions of doping, buffer layers or other layers. Non-substrate layers 120 can include a light emitting region (or active region), typically a compound semiconductor such as InGaN or AlInGaP or AlGaN. LED 110 can be rectangular (including square), hexagonal, circular or have another geometric or irregular shape.

LED 110 is mounted to a submount 125. According to one embodiment, submount 125 that can be made of a material with high thermal conductivity to spread and conduct the heat produced by LED 110. Any suitable submount known or developed in the art can be used. LED 110 is disposed in an LED cavity 130 defined by housing 135. Housing 135 can be a portion of a larger housing, a layer(s) of material mounted on submount 125 or other material positioned around LED 110 that forms a cavity in cooperation with submount 125 or other layer. For example, according to one embodiment, material 135 can be a layer of molded plastic mounted to submount 125.

LED cavity 130, according to one embodiment, can have straight sidewalls that are parallel to the sides of the LED (i.e., vertical from the perspective of FIG. 1). In other embodiments, the walls of LED cavity 130 can be curved (e.g., parabolic, multi-parabolic or other curved shape), tapered or otherwise shaped to better direct light upwards. LED cavity 130 can be filled with air, molded silicone, silicone mixed with phosphor particles, molded plastic, or other encapsulant. Using a material having a higher index of refraction than LED 110 can prevent light from being trapped in LED 110 due to total internal reflection ("TIR") in LED 110, thereby allowing more light to escape into LED cavity 130.

A reflector 140 (see FIG. 2) disposed around LED 110 can reflect light toward lens 105. In some embodiments, reflector 140 can be a discrete component. By way of example, but not limitation, the reflector can be Teflon, Teflon paper, diffuse reflective plastic, silver coated plastic, white paper, TiO2 coated material or other reflective material. In another embodiment, reflector 140 can be formed through selection of material 135 or the encapsulant. For example, material 135 can be a white plastic material such that the walls inherently form a diffuse white reflector. In another embodiment, reflector 140 can be formed by the surface tension of an encapsulant disposed in LED cavity 130.

In some cases, an LED may only leak light out the sides of some portions of the LED. In the embodiment of FIG. 4, for example, the substrate 115 may include non-transparent sides such that LED 110 does not emit light from the sides of its substrate 115. Consequently, optical system 110 can be constructed so reflector 140 only surrounds the side portions of LED 110 through which light is emitted.

Lens 105 can include an entrance face 150 to receive light into the lens body 107 of lens 105. Lens body 105 is the primary portion of lens 105 that is responsible for guiding or distributing light from an entrance face to an exit face. It should be noted, however, lens 105 can include additional layers, such as buffer or protective layers, that light may traverse prior to entering entrance face 150. According to one embodiment, entrance face 150 can be parallel to the primary emitting plane of LED 110 (e.g., a plane parallel to face 117 in FIG. 2). A phosphor layer 145 can be disposed on lens 105 between the entrance face of lens body 107 and LED 110. The phosphor layer can be disposed directly on the entrance face 150 or on a buffer layer between phosphor layer 145 and entrance face 150. The phosphor in phosphor layer 145 absorbs the higher energy, short wavelength light waves, and re-emits lower energy, longer wavelength light. Light emitted by phosphor layer 145 can enter the lens body 107 through entrance face 150.

According to one embodiment, phosphor layer 145 can include a layer of phosphor particles in a binding material, such as silicone, coated on the entrance face 150 of lens body 107. The phosphor particles can include any suitably sized phosphor particles including, but not limited to, nano-phosphor particles, quantum dots, or smaller or larger particles and can include a single color or multiple colors of phosphor particles. In other embodiments, the phosphor layer 145 can be separated from the entrance face 150 of lens body 107 by one or more buffer layers. There may also be additional layers of material coupled to lens body 107 between phosphor layer 145 such that, for example, phosphor layer 145 is sandwiched between entrance face 150 layers material. To prevent losses due to TIR at boundaries between layers of materials or adhesives, one embodiment can employ materials with matched or successively higher indexes of refraction as the layers get closer to lens body 107 without exceeding the index of refraction of lens body 107.

The color of light emitted by system 100 can be selected based on LED 110 and the phosphor particles in phosphor layer 145. For example, LED 110 can be a UV LED and phosphor layer 145 can include phosphors that down convert UV light to red, green, blue, yellow or other color light. In another example, LED 110 can be a blue LED and phosphor layer 145 can down convert the blue light into a desired color. Reflector 140 can be selected to reflect both the color light emitted by the LED 110 and the down converted light from phosphor layer 145.

Lens 105 is positioned so that phosphor layer 145 is maintained a distance from LED 110. The position of lens 105 can be maintained by a housing, coupling lens 105 to encapsulant in LED cavity 130 or otherwise positioning lens 105 relative LED 110. If lens 105 is adhered to an encapsulant, an adhesive with an index of refraction equal to or greater than that of the encapsulant can be used to prevent TIR at the encapsulant/adhesive boundary.

Lens 105 can act as a light guide to guide light from entrance face 150 to exit face 155. Examples of a lens 105 that can utilize TIR at shaped sidewalls 157 to guide light to exit face 155 are described below and in United Sates, Provisional Patent Application No. 60/756,845, entitled "Optical Device", to Duong et al., filed Jan. 5, 2006 and U.S. patent application Ser. No. 11/649,018 entitled "Separate Optical Device for Directing Light from an LED," filed Jan. 3, 2007, each of which is hereby fully incorporated by reference herein. Lens 105 can be a separate optical device designed so that all the light can be extracted out exit face 155 (not accounting for Fresnel losses) in the smallest package design possible through selection of exit face area 155, distance between the exit face 155 and entrance face 150 and the design of sidewalls 157. Other embodiments can be shaped to have different sizes or achieve different extraction efficiencies. For example, according to one embodiment, lens 105 can be configured such that at least 70% of the light entering lens body 107 at entrance 150 exits exit face 155. Lenses 105 with lower extraction efficiencies can also be used. Additionally, the lens 105 can be selected to provide a uniform light distribution and to emit light at a desired half-angle. The shape of lens 105, according to one embodiment, can be selected as described below in conjunction with FIGS. 19A-19D. Other embodiments of lenses can also be used, including, but not limited to, dome, Fresnel, conical, tapered or other lenses. According to one embodiment, the lens body 107 can be a solid piece of material having a single index of refraction.

In operation, LED 110 produces light that can exit LED 110 from surface 117 (see FIG. 2) and sides 119 (see FIG. 2). Reflector 140 acts as a redirecting lens to redirect light escaping sides 119 to entrance surface 150 of lens body 107. When the light is incident on phosphor layer 145, phosphor layer 145 down converts the light and emits light into lens body 107 and back into LED cavity 130. Reflector 140 can again direct the light in LED cavity 130 to entrance face 150. Lens body 107 guides light entering entrance face 150 from phosphor layer 145 to exit face 155. If lens body 107 provides light in a uniform distribution in a desired half-angle, the need for additional lenses is not required to shape the beam. Consequently, color conversion and beam shaping can be achieved with a single lens.

One consideration is that phosphor can heat to a temperature of approximately 150 degrees Celsius during use. Consequently, lens body 107 can be constructed of a material that can withstand continuous use at this temperature. In another embodiment, a buffer layer of silicon or other material capable of withstanding high temperatures can be introduced between the phosphor layer 145 and entrance face 150 of lens 105. While thicker or thinner buffers can be used, one embodiment can include a layer of silicon that is 100 to 200 microns thick. This can allow, for example, polycarbonates to be used for lens body 107.

Figure 5:
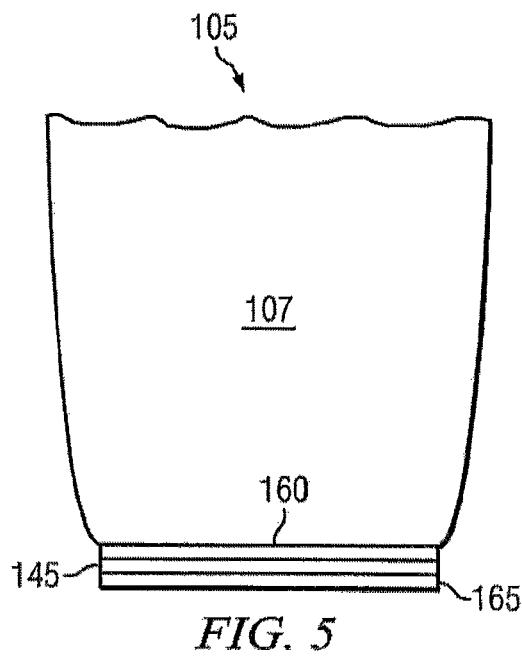
FIGS. 5-6 are diagrammatic representations of embodiments of phosphor coated lenses.
Figure 6:
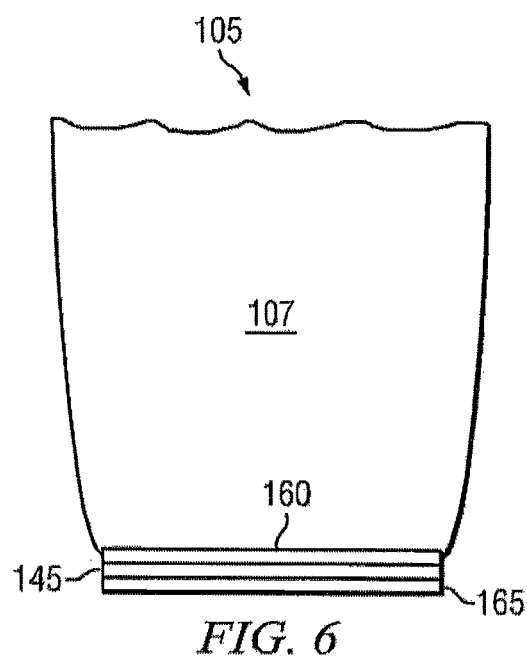
Figure 7:
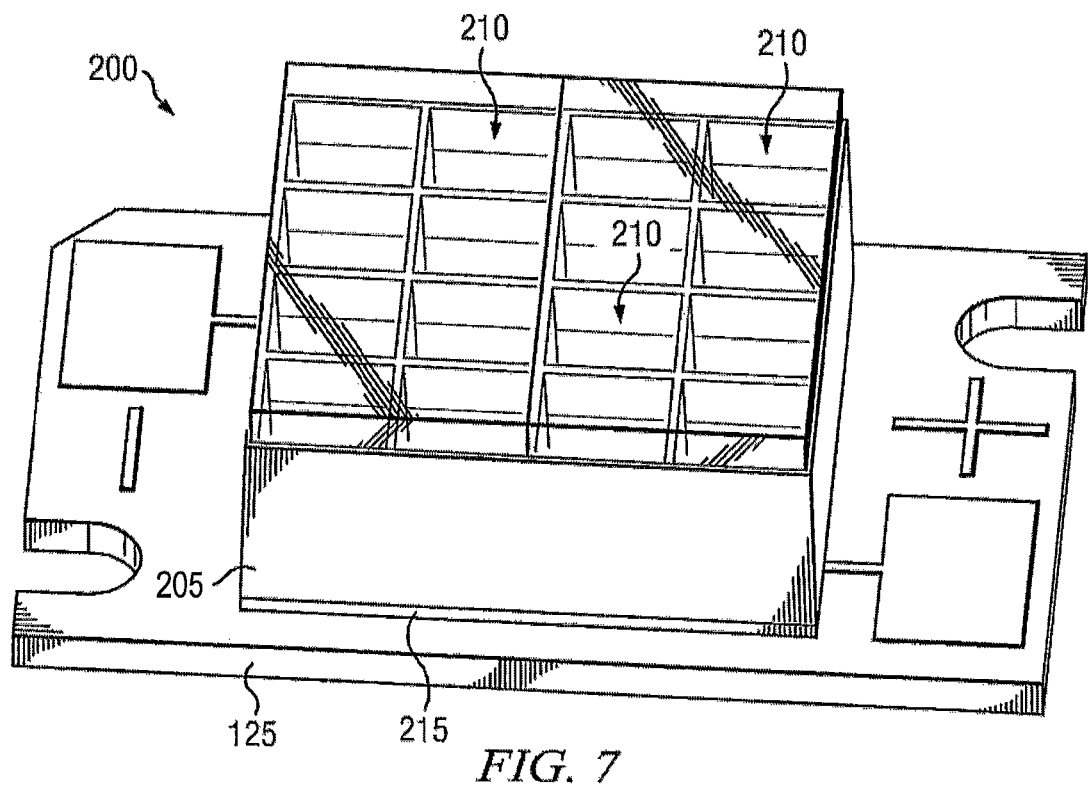
FIG. 7 is a diagrammatic representation of one embodiment of a packaged array.

FIGS. 5 and 6, for example, are diagrammatic representations of embodiments of lens 105 having body 107, a buffer 160 layer and phosphor layer 145. The buffer layer can be a suitable, high temperature material such as silicon or other material that can withstand the operating temperatures of the selected phosphor layer 145. In one embodiment, buffer 160 can be adhered to or otherwise coupled to the bottom of lens body 107 or, as shown in FIG. 7, all or a portion of buffer 160 can rest in a pocket formed at the entrance face of lens 105. The phosphor layer can be disposed on lens 105 as a coating on buffer layer 160. FIGS. 5 and 6 also illustrate an adhesive layer 165 to adhere lens 105 to an encapsulant in LED cavity 130 (FIGS. 1-4). To prevent TIR, each successive layer, including adhesives, can have a higher or the same index of refraction as the layer below it, with no layer between LED 110 and lens 105 having a higher index of refraction than lens body 107.

Embodiments described herein provide an advantage over traditional systems of using phosphors with LEDs because the phosphor is removed a distance from the LED. Because the phosphor is located at the entrance of the lens, there is high coupling efficiency. Additionally, self-heating of the phosphor due to Stoke's shift can be reduced because heat can be dissipated through the material of lens 140, housing 135 and/or submount 125. Higher phosphor conversion efficiency can also be achieved due to low flux density at the entrance face 150 of lens 105.

The distance between phosphor 145 and LED 110 can be optimized to provide an optimal balance between thermal considerations and effective phosphor package efficiencies. While any suitable gap size can be used as needed or desired, one embodiment of an optical system has a gap of 100-200 microns between surface 117 (see FIG. 2) and phosphor layer 145.

Additionally, embodiments described herein provide for flexible optical system architectures. Because the phosphor coated lens can be separate from the LED chip, it can be used in conjunction with various types of optical devices, including conventional light emitting devices. Furthermore, LEDs 110 can be used with a variety of different lens types depending on need.

Some embodiments of lenses 105 can be tightly packed in an array. According to one embodiment, an array of lenses 105 can be formed where each lens 105 is selected to emit light in a desired half-angle having a uniform distribution in near and far fields. The lenses 105 can be spaced so that there are no perceivable gaps between emitted light for adjacent lenses 105. Because the emitted light from each lens 105 is uniform and in a desired half-angle, the light output of the array will be in the desired half-angle with uniform near and far field distributions, but covering a larger area than the light emitted by a single lens. This provides a very practical benefit for display or lighting manufacturers because additional optics are no longer required to get light from an LED array using phosphors into a desired angle.

FIG. 7 is a diagrammatic representation of one embodiment of a packaged array 200. In the embodiment of FIG. 7, packaged array 200 comprises submount 125, main housing 205 and cover 210. Submount 125 provides mechanical support and electrical connections for LEDs. Embodiments of submount materials include, but are not limited to: Low Temperature Cofire Ceramic (LTCC) with thermal vias, High Temperature Cofire Ceramic (HTCC) with thermal vias, Beryllium Oxide (BeO) ceramic, Alumina ceramic, Silicon, Aluminum Nitride (AlN), Metal (Cu, Al, etc.), and Flex circuit.

Main housing 205 can be formed of suitable materials including, but not limited to, plastic, thermoplastic, and other types of polymeric materials. Composite materials or other engineered materials may also be used. In some embodiments, main housing 205 may be made by a plastic injection molding manufacturing process. Various molding processes and other types of manufacturing processes may also be used. In some embodiments, main housing 205 may be opaque. In some embodiments, main housing 205 may be transparent or semi-transparent. Main housing 205 can be bonded or otherwise coupled to a layer of material 215 to complete the housing about the LEDs and lenses. In other embodiments, the housing can be formed of any number of layers or pieces of suitable material that will not unacceptably deform during operation due to heating and can protect the LEDs and lens for expected contact or shock during use, transportation or manufacture.

In the embodiment of FIG. 7, packaged array 200 is a 4×4 array and each group of 4 lenses shares a cover 210. In other embodiments a single cover 210 can be used for all lenses or each lens can have its own cover 210. Cover 210, according to one embodiment, can have a sufficient thickness to prevent the lenses from becoming damaged during handling of packaged array 200.

Figure 8:
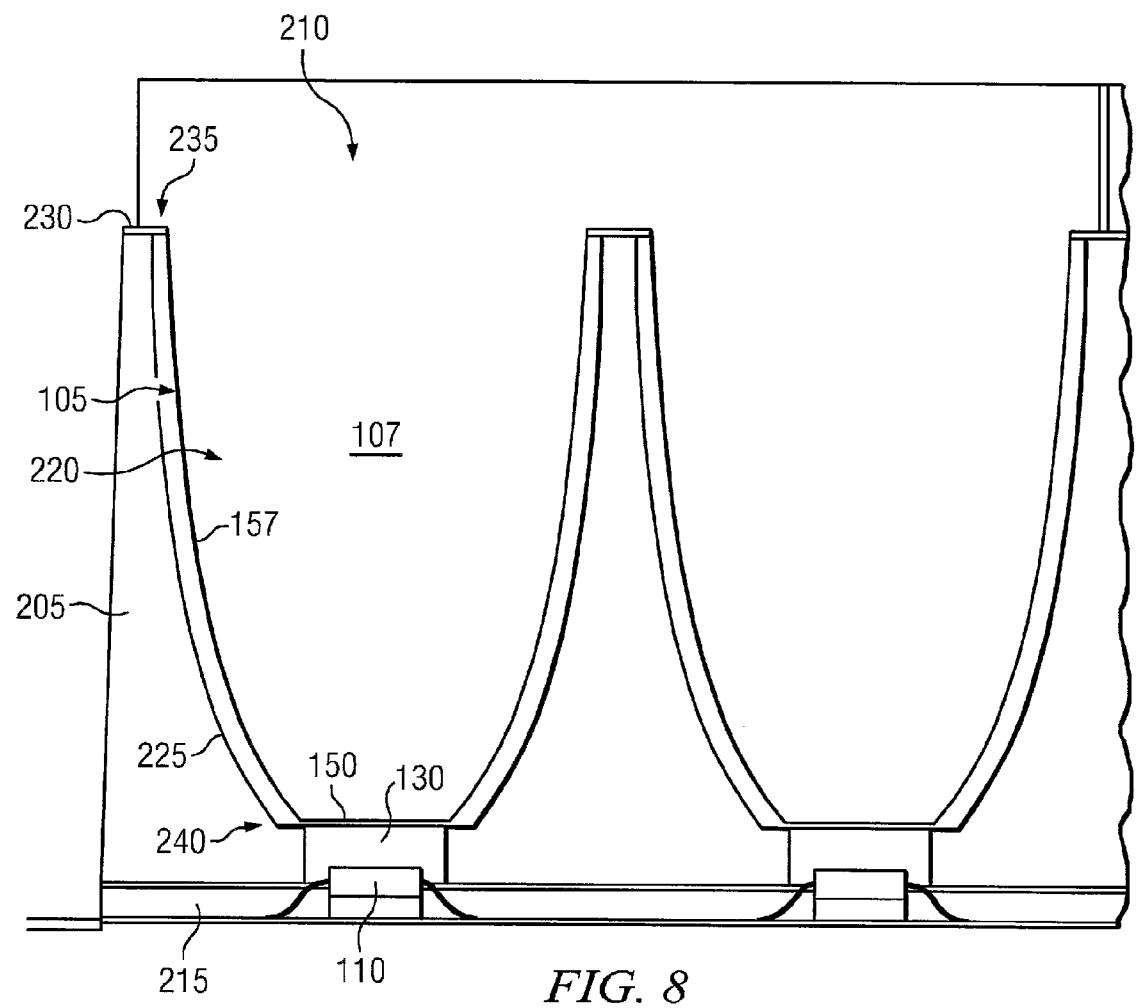
FIG. 8 is a diagrammatic representation of a cross-section of an embodiment of a packaged array.

FIG. 8 is a diagrammatic representation of a cross-sectional view of one embodiment of packaged array 200 illustrating main housing 205, lens 105, cover 210, LED 110, LED cavity 130, housing layer 215 and submount 125 (only on instance of each is indicated for clarity). In the embodiment of FIG. 8, cover 210 is integrated with lens 105 such that they form a single lens assembly. Cover 210 can be integrated with other lenses 105 so that a single lens assembly will have a cover portion and multiple lens portions. The body 107 of lens 105 and cover 210 can be made of a single piece of molded plastic, polycarbonate or other material. In other embodiments, cover 210 can be coupled to lens 105 using an adhesive. Cover 210 also may simply be in contact with lens 105 or may be separated from lens 105 by a gap. Preferably, cover 210 and any adhesive or other layers between lens 105 and cover 210 can have indexes of refraction selected to prevent TIR at the exit face of lens 105. The shape of lens body 107 can be selected to account for the transition into cover 210.

Cover 210 can be an optically transparent material, such as a plastic, glass, composite material, or other material and may include one or more layers. Additionally, cover 210 may include layers of material to perform photon conversion (e.g., an additional phosphor layer, filtering or other functions with respect to light exiting lens 105.

Main housing 205 forms a lens cavity 220 sized to fit lens 105. The sidewalls 225 of lens cavity 220 can be curved to match or approximate the sidewall shapes of lens 105 so that the size of lens cavity 220 is smaller proximate to the corresponding LED cavity 130 and larger distal from LED cavity 130. In other embodiments, the sidewalls 225 can be vertically straight (from the perspective of FIG. 8) or can be tapered. Sidewalls 225 can include reflective coatings or other coatings to reflect any light leaking from the sides of lens 105 to the exit of cover 205. In another embodiment, main housing 205 can be formed of white plastic or other color material so that sidewalls 225 form reflectors.

According to one embodiment, lens cavity 220 can be sized so that there is a gap between the sidewalls of lens body 107 and sidewalls 225 of lens cavity 220 to preserve TIR in lens body 107. The size of the gap can be constant or can increase or decrease further from the base of lens cavity 220. The gap can be filled with air or other material. Preferably, the material has a lower index of refraction than body 107 of lens 105. In other embodiments, sidewalls 225 can contact sidewalls of lens body 107 and act as a reflector for light in lens body 107.

Main housing 205 can include a shoulder 230 on which ledge 235 of cover 210 rests. An adhesive, mechanical fasteners or other suitable fastening mechanism can be used to couple cover 210 to main housing 205. In other embodiments a secondary structure, such as a clamping structure, can maintain cover 210 against main housing 205.

According to one embodiment, by coupling cover 210 to main housing 205, lens 105 is held in a desired position in lens cavity 220. In this case, lens 105 may not require additional attachment to cover 205. In other embodiments, a portion of lens 105 can be adhered to or otherwise coupled to a shoulder 240 at the base of lens cavity 220 or other portion(s) of lens 105 can be coupled to main housing 205.

Main housing 205 defines a portion or all of LED cavity 130 in cooperation with submount 125 and housing layer 215. Although LED cavity 130 is shown with vertical sidewalls, LED cavity 130 can have tapered, curved or otherwise shaped sidewalls to act as a redirector lens. The opening to LED cavity 130 can have the same shape as and be rotationally aligned with LED 110 or can have another shape or alignment.

A phosphor layer can be disposed proximate to entrance face 150 such that light exiting LED cavity 130 will be incident on the phosphor layer. The phosphor layer down converts light before the light enters lens body 107. The down converted light is guided through lens 105 and exits cover 210. Entrance face 150 of lens body 107 can be the same shape as and be rotationally aligned with the opening to LED cavity 130 or have another shape or alignment.

Figure 9:
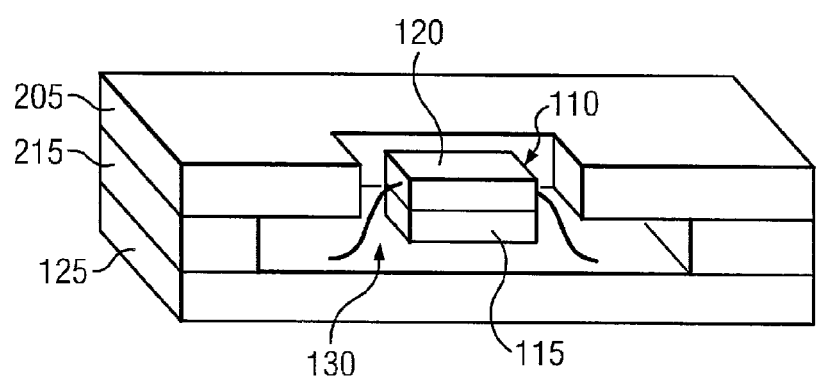
FIG. 9 is a diagrammatic representation of an LED in a cavity.

FIG. 9 is a diagrammatic representation of a cutaway view of one embodiment of an LED cavity 130. Submount 125 forms the base of the cavity, while the sidewalls are formed by main housing 205 and layer 215. According to one embodiment, a portion of LED 110 can extend into the portion of LED cavity 130 defined by main housing 205. For example, the non-substrate layers 120 including the active region of the LED may extend into this opening or, in a flip chip design, the substrate 115 may extend into this portion. LED cavity 130 can become larger closer to submount 125 to accommodate electrical connections or otherwise provide space around LED 110. While portions of submount 125, layer 215 and main housing 205 are shown, the packaged array 200 can include additional layers that define cavity 130.

Figure 10:
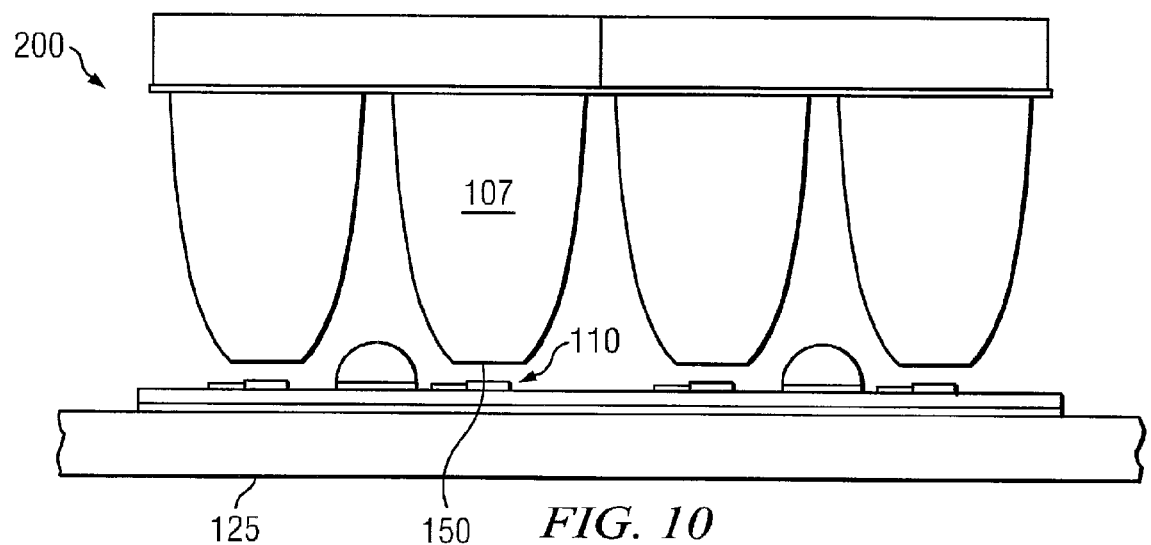
FIG. 10 is a diagrammatic representation of a portion of an embodiment of a packaged array.

FIG. 10 is a diagrammatic representation of packaged array 200 with main housing 205 removed. It can be noted in FIG. 10 that the entrance face 150 to lens body 107 is maintained a distance away from the corresponding LED 110. Consequently, any phosphors disposed on or near the entrance face will also be separated from LED 110.

Figure 11:
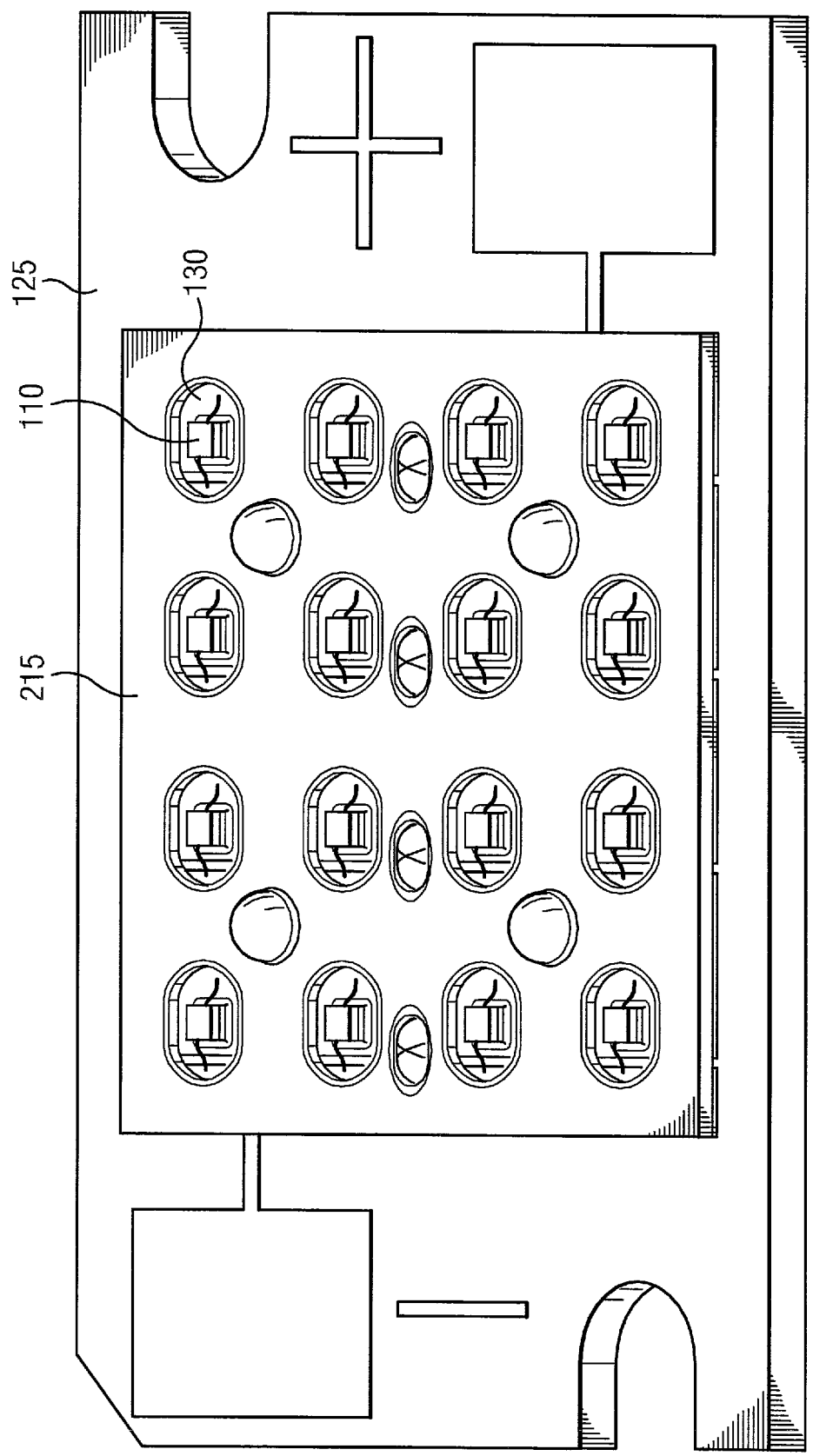
FIG. 11 is a diagrammatic representation of another portion of an embodiment of a packaged array.

FIG. 11 is a diagrammatic representation of one embodiment of a portion of packaged array 200 showing layer 215 and submount 125. Layer 215 can be adhered or otherwise coupled to submount 125. Layer 215 can form a portion of LED cavity 130 around LED 110. While, in the embodiment of FIG. 11, LED cavity 130 has straight vertical sidewalls, LED cavity 130 can have curved, tapered or otherwise shaped sidewalls and can act as a reflector. The area of LED cavity 130 defined by layer 215 can be larger than that defined by main housing 205 to accommodate electrical connections or to otherwise provide space around LED 110. In other embodiments, the cavity can have a uniform size or become wider as it approaches lens 105. Cavity 130 can be entirely or partially filled with an encapsulant, air, silicone "goop", or other filler material.

Figure 12:
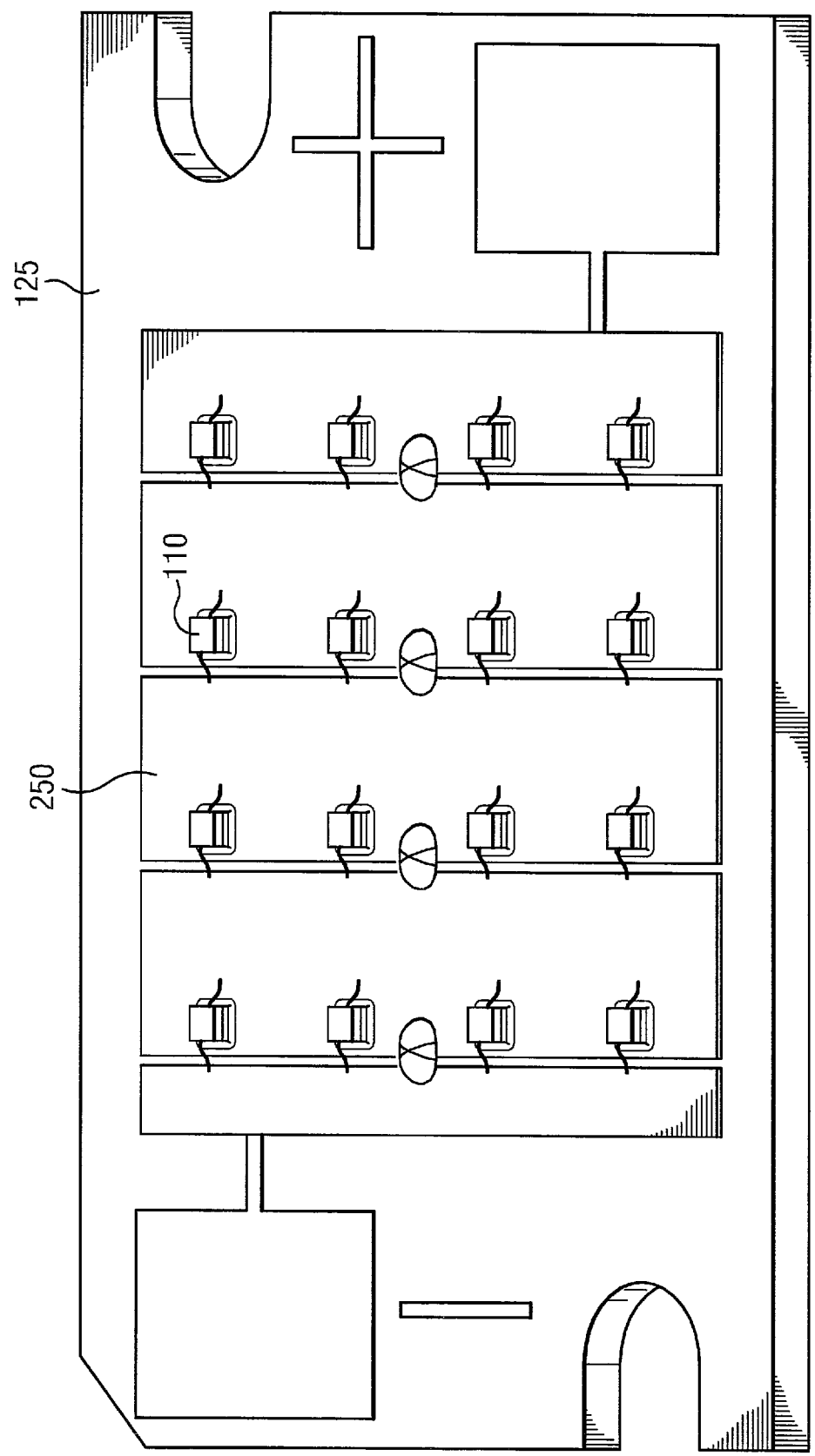
FIG. 12 is a diagrammatic representation of an array of LEDs mounted on a submount.

FIG. 12 is a diagrammatic representation of one embodiment of LEDs 110 mounted on submount 125. Submount 125, as illustrated in FIG. 12, can provide support for LEDs 110 and provide electrical connections 250. Electrical connections can be provided using suitable metals or other conductors. While a particular pattern and type of electrical connection are illustrated, any suitable electrical connections to LED 110 and submount 125 can be provided.

Figure 13:
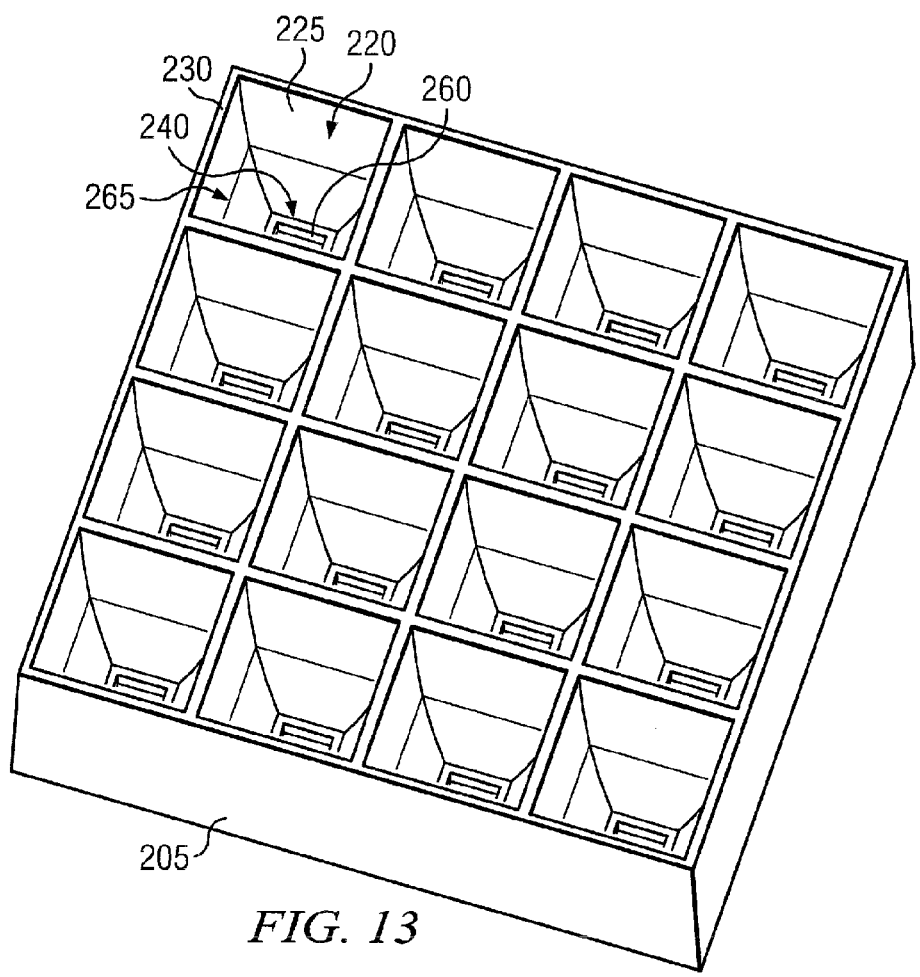
FIG. 13 is a diagrammatic representation of an embodiment of a portion of a housing of a packaged array.

FIG. 13 is a diagrammatic representation of one embodiment of main housing 204 defining lens cavities 220 sized to fit lenses 105. Lens cavity 220 extends from an opening 260 to LED cavity 130 to a second opening 265. The sizes of the openings can have, according to one embodiment, a ratio that is the same as the size ratio of the exit face to entrance face of the lens. In another embodiment, opening 260 may be approximately the same size as the entrance face to the lens 105 while opening 265 is larger than the exit face. Sidewalls 225 can be curved, tapered, vertical or have another selected shape. A shoulder 230 provides a surface to which cover 210 can be coupled.

In the embodiment of FIG. 13, main housing 205 forms a 4×4 array. However, main housing 205 can accommodate larger or smaller arrays or a single optical system. Additionally, main housing 205 can be shaped to accommodate circular, hexagonal or other shaped lenses 105 in a tightly packed array.

Figure 14:
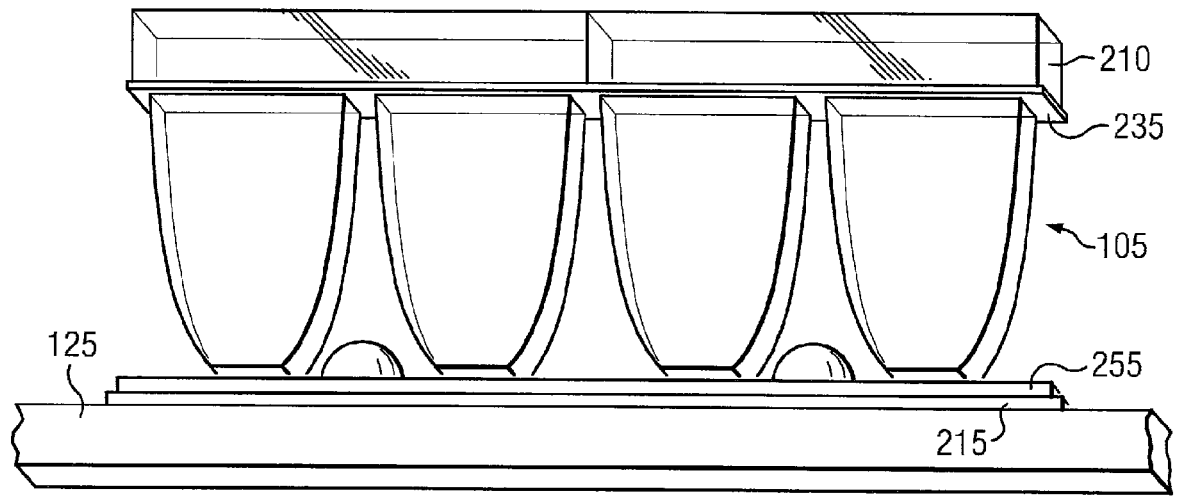
FIG. 14 is a diagrammatic representation of a portion of another embodiment of a packaged array.
Figure 15:
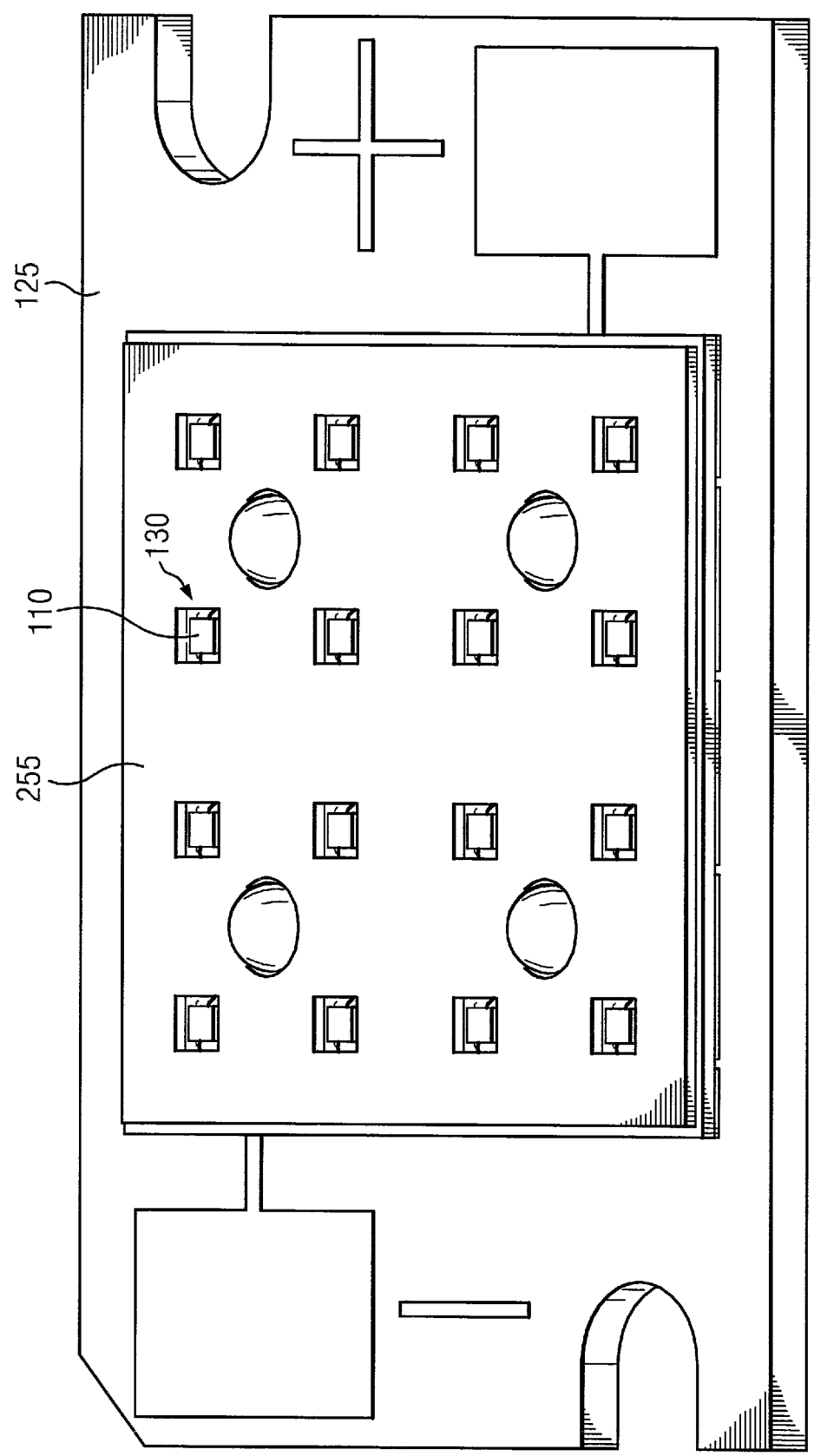
FIG. 15 is a diagrammatic representation of another portion of the embodiment of the packaged array.

FIGS. 8-13 provide an example embodiment of a packaged LED. As discussed above, however, there may be additional portions of housing or other components in the packaged array. For example, the embodiment of FIG. 14 is similar to that of FIG. 8, but also illustrates layer 255. A portion of the cavity that houses LED 110 can be formed by layer 255 rather than the main housing 205. In this case, main housing 205 can define lens cavities 220 with sidewalls that extend to layer 255. Housing layers 255 and 215, on the other hand, define the LED cavities 130. Layers 215 and 255 can include any suitable materials including plastics or other materials. Layer 255 can be inset from layer 215 to form a ledge to which main housing 205 can be bonded. The use of layers 215 and 255 can ease manufacturability by providing a mechanism by which to align main housing 205. FIG. 15 is a diagrammatic representation of one embodiment of a portion of a packaged array 200 with lenses 105 and cover 210 removed illustrating that layer 255 can define a portion of and provide an opening to LED cavity 130.

Figure 16:
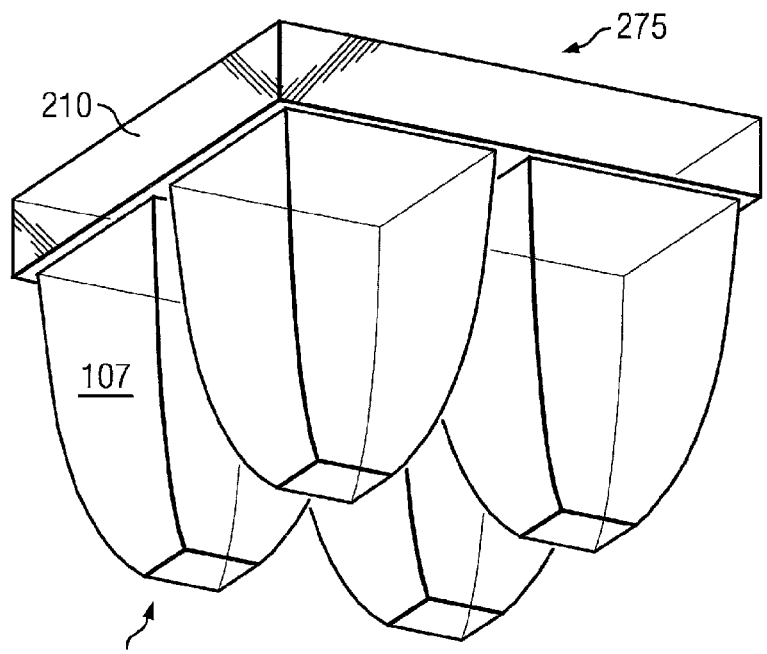
FIG. 16 is a diagrammatic representation of an embodiment of a lens assembly.

FIG. 16 is a diagrammatic representation of a lens assembly 275 comprising portions with shape sidewalls that form lens bodies 107 of lenses 105 and a portion without shaped sidewalls that acts as cover 210. The shaped and unshaped portions can be a single piece of material. Each lens 105 can be a phosphor coated lens selected to emit a desired color light. If more than one phosphor lens is used in a system, multiple types of phosphors may be used to achieve the desired color temperature and CRI. For instance, three yellow phosphor lenses and one red phosphor lens may be used in conjunction with a blue pump to attain warm white light. Since each of the four phosphor lens can emit to the same far field distribution, the colors will undergo superposition and will not bleed or create ring-like effects. As another example, in the 2×2 array of lenses shown, each lens can be selected to emit red, green or blue light. The light from lenses 105 can be combined to form white light. In another embodiment, each assembly 275 can emit a single color light. In a 4×4 array as shown in FIG. 7, for example, four lens assemblies 275 can be used. One lens assembly 275 can emit blue light, one assembly 275 can emit red light and two assemblies 275 can emit green light such that the array as whole acts as a white light source. A lens assembly 275 can include any number of lenses 105.

As discussed below, lenses 105 can be configured with lens bodies 107 shaped to conserve radiance (or come within an acceptable percentage of conserving radiance), control the emission angle of light and emit light with a uniform or other desired distribution. As long as lenses 105 are tightly enough packed, there will be no gaps between the light emitted by lenses 105. Consequently, the light emitted by array 200 as a whole will be within the desired half-angle and appear uniform with no dark spots or ghosting.

Referring again to FIG. 1, FIG. 1 illustrates an embodiment of a lens 105 having a lens body 107 with an entrance face 150, an exit face 155 and sidewalls 157. According to one embodiment, lens 105 can be constructed with the assumption that phosphor layer 145 will emit uniformly into entrance face 150. To conserve radiance so that all the light entering lens body 107 through entrance face 150 can be extracted through exit face 155, the area of exit face 155 is selected according to the entendu equation such that:

$$\frac{n_1^2 A_1 \Omega_1}{n_2^2 \Omega_2} = A_2 \quad [\text{EQN. 1}]$$

Where $\Omega_1$=effective solid angle whereby light enters through entrance face 150; $\Omega_2$=effective solid angle whereby light leaves exit face 155; $A_1$=area of entrance face 150; $A_2$=area of exit face 155; $n_1$=refractive index of material of lens body 107; and $n_2$=refractive index of substance external to the exit face 155 of lens body 107 (e.g. air or other medium). In another embodiment, it can be assumed that $A_1$ is the size of the phosphor layer and that the phosphor layer acts as a uniform emitter over that area. Thus, the size of the exit face can be based on the area of the entrance face covered by phosphor, even if the physical size of the entrance face is larger.

There are various models for determining effective solid angle including those described in U.S. patent application Ser. No. 11/906,194 entitled "LED System and Method" to Duong, et al. filed Oct. 1, 2007, U.S. patent application Ser. No. 11/906,219 entitled "LED System and Method" to Duong, et al., filed Oct. 1, 2007 and U.S. patent application Ser. No. 11/649,018 entitled "Separate Optical Device for Directing Light from an LED," filed Jan. 3, 2007, each of which is hereby fully incorporated by reference herein. Preferably, the area of exit face 155 is within 30% (plus or minus) of the minimum area necessary to conserve radiance.

The distance between exit face 155 and entrance face 150 can be selected so that all rays having a straight transmission path from entrance face 150 to exit face 155 are incident on exit face 155 at less than or equal to the critical angle at exit face 155 to prevent TIR at exit face 155. According to one embodiment, the minimum distance can be selected based on a limiting ray. The limiting ray is a ray that travels the longest straight line distance from entrance face 150 to exit face 155. For square or rectangular faces 150 and 155, the limiting ray will be a ray that travels from a corner of entrance face 150 to the opposite corner of exit face 155. Preferably, the distance between the entrance face 155 and exit face 155 is within 30% of this minimum distance.

In addition, the sidewalls 157 can be shaped. Broadly speaking, the sidewall shapes are determined so that any ray incident on a sidewall is reflected to exit face 155 and is incident on exit face 155 at the critical angle or less (i.e., so that there is no loss due to internal reflection at exit face 155). While, in one embodiment, the sidewalls are shaped so that all rays that encounter the inner surface of the sidewalls experience total internal reflection to exit face 155 and are incident on exit face 155 at the critical angle or less, other sidewall shapes that allow some loss can be used.

Figure 17A:
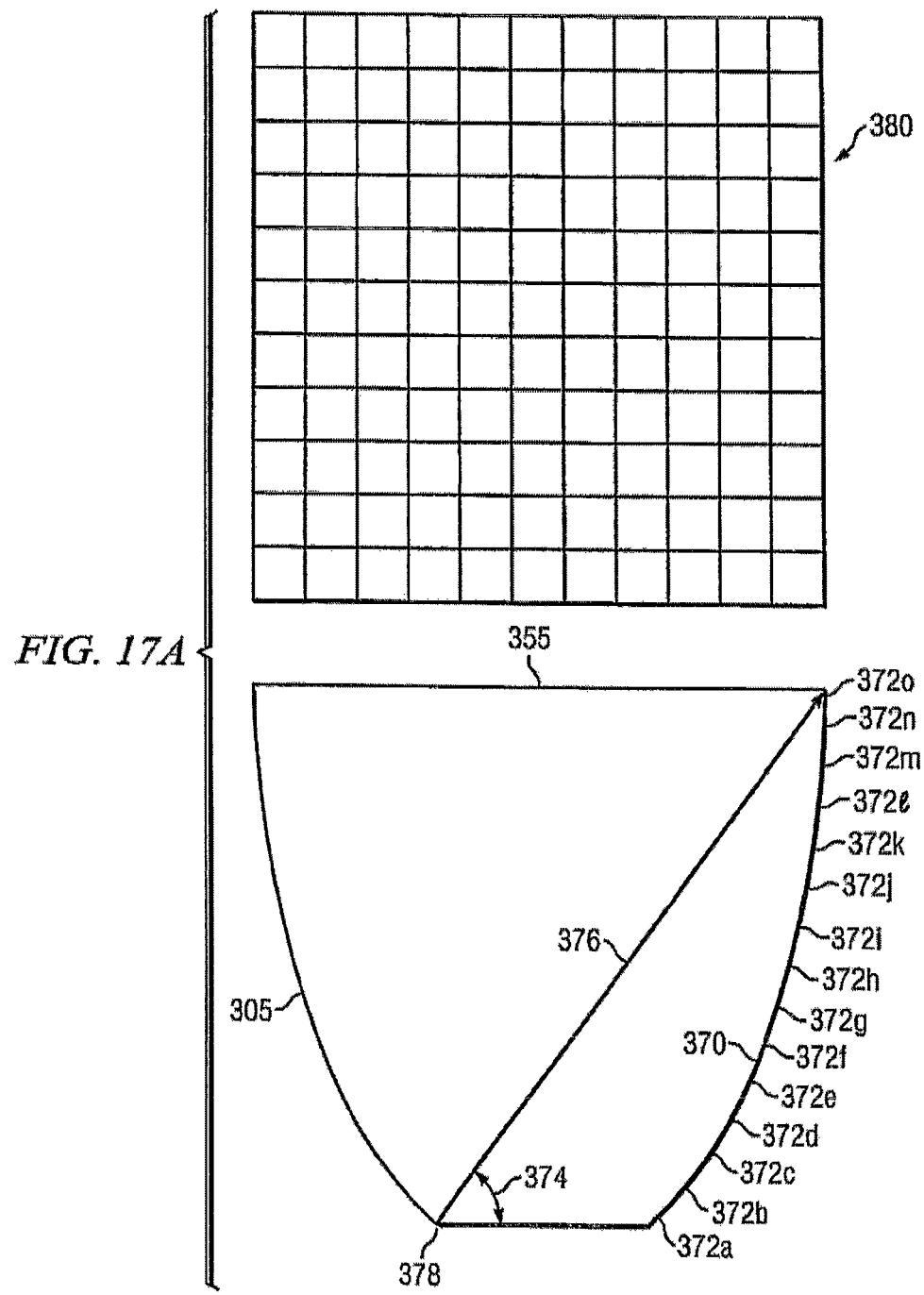
FIG. 17A is a diagrammatic representation of a cross-section of a model of a lens for determining sidewall shapes.

FIG. 17A is a diagrammatic representation of a cross-section of a model of lens 305 for determining sidewall shapes. Sidewall shapes can be determined using computer-aided design. A model of the sidewall can be created in a computer-aided design package and simulations run to determine an appropriate sidewall shape.

According to one embodiment, each sidewall can be divided into n facets with each facet being a planar section. For example, model sidewall 370 is made of fifteen planar facets 372a-372o rather than a continuous curve. The variables of each facet can be iteratively adjusted and the resulting distribution profiles analyzed until a satisfactory profile is achieved as described below. While the example of fifteen facets is used, each sidewall can be divided into any number of facets, including twenty or more facets.

Each facet can be analyzed with respect to reflecting a certain subset of rays within a lens. This area of interest can be defined as an "angular subtense." The angular subtense for a facet may be defined in terms of the angles of rays emanating from a predefined point. Preferably, the point selected is one that will give rays with the highest angles of incidence on the facet because such rays are the least likely to experience TIR at the facet. In a lens with a square shaped entrance area, for example, this will be a point on the opposite edge of the entrance.

According to one embodiment, for a selected $A_1$, $A_2$, and height, the maximum of angle 374 of any ray that will be incident on a given sidewall (e.g., sidewall 370) without being previously reflected by another sidewall can be determined. In this example, ray 376 emanating from point 378 establishes the maximum angle 374 for sidewall 370. If the maximum of angle 374 is 48 degrees and there are 15 facets for sidewall 370, each facet (assuming an even distribution of angular subtenses) will correspond to a 3.2 degree band of angle 374 (e.g., a first facet will be the area on which rays emanating from point 378 with an angle 17 of 0-3.2 degrees are incident, the second facet will be the area on which rays emanating 374 from point 378 with an angle 95 of 3.2-6.4 degrees are incident, and so on).

For each facet, the exit angle, facet size, tilt angle, or other parameter of the facet can be set so that all rays incident on the facet experience TIR and are reflected to exit surface 355 such that they are incident on exit surface 355 with an angle of incidence of less than or equal to the critical angle. Preferably, the sidewalls are also shaped so that a ray viewed in a cross-sectional view only hits a side wall once. However, there may be additional reflection from a sidewall out of plane of the section. For a full 3D analysis, a ray that strikes a first sidewall near a corner, may then bounce over to a second side wall, adjacent to the first, and from there to the exit face. A curve fit or other numerical analysis may be performed to create a curved sidewall shape that best fits the desired facets.

To optimize the variables for each facet, a simulated detector plane 380 can be established. Detector plane 380 can include x number of detectors to independently record incident power. A simulation of light passing through the lens 305 may be performed and the intensity and irradiance distributions as received by detector plane 380 analyzed. If the intensity and irradiance distributions are not satisfactory for a particular application, the angles and angular subtenses of the facets can be adjusted, a new curved surface generated and the simulation re-performed until a satisfactory intensity profile, exitance profile or other light output profile is reached. Additional detector planes can be analyzed to ensure that both near field and far field patterns are satisfactory. Alternatively, the simulation(s) can be performed using the facets rather than curved surfaces and the surface curves determined after a desired light output profile is reached. In yet another embodiment, the sidewalls can remain faceted and no curve be generated.

Figure 17B:
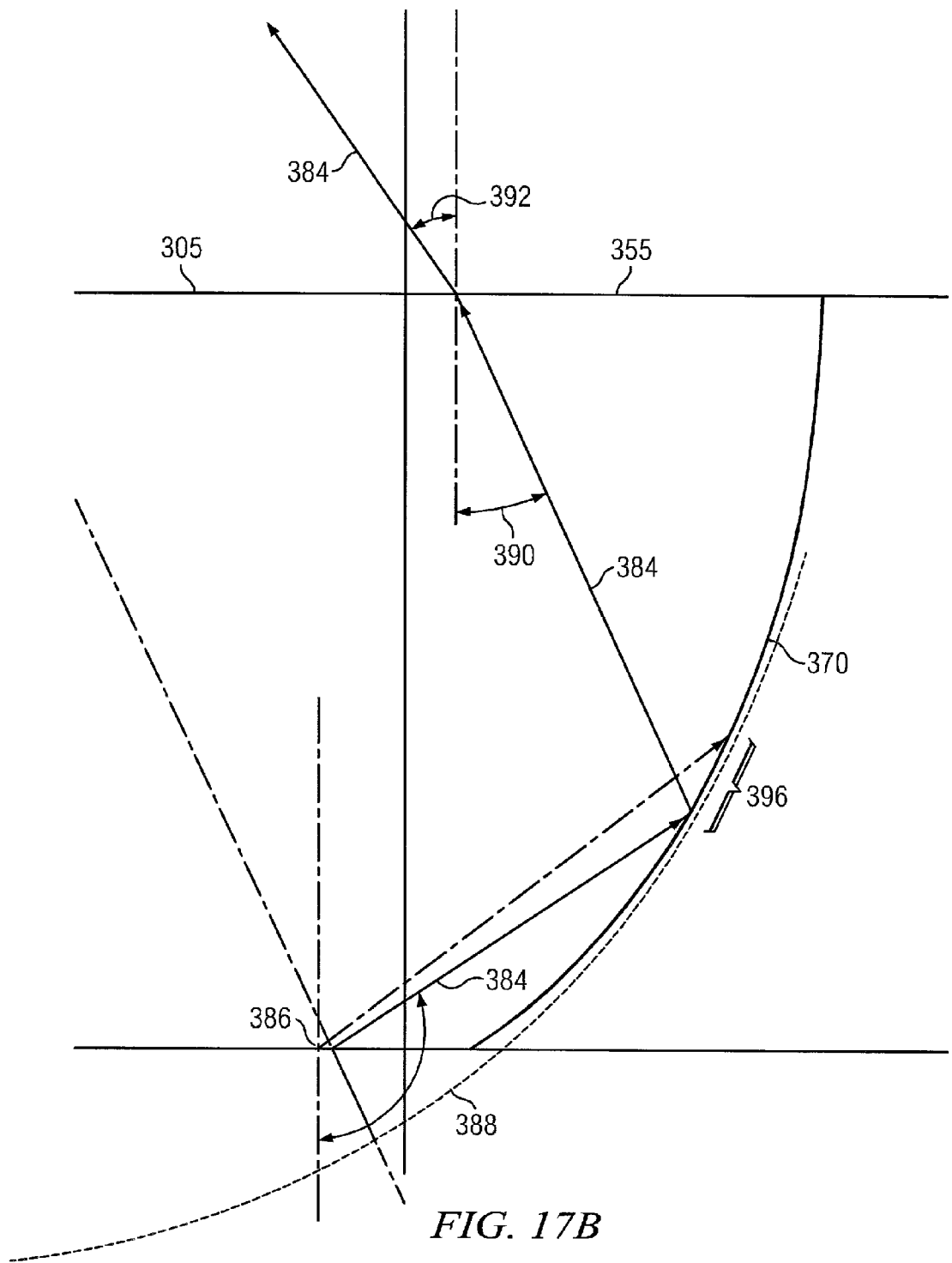
FIG. 17B is a diagrammatic representation of an embodiment of a portion of a sidewall of a lens.

According to another embodiment, the sidewall shape can be selected based on multiple parabolas with each planer facet representing a linear approximation of a portion of a parabola. For example, FIG. 17B is a diagrammatic representation of a portion of a modeled lens 305. In FIG. 17B, a hypothetical ray 384 is depicted that emanates from the focus 386 of a parabola 388 and intersects sidewall 370 such that it is reflected off sidewall 370 due to TIR and traverses the lens 305 to intersect exit plane 355 at an exit angle 390 that is less than the critical angle and exits lens 305 into air or other medium. As can be seen from FIG. 17B, at the transition from the lens 305 to air, ray 384 bends as described by Snell's law. Since the tangent point of the sidewall is determined from a parabola and because the ray incident and reflected off the sidewall is in the same medium, the ray will be parallel to the optical axis of the parabola. Thus, light is projected with a half-angle 392. Angular subtenses 396 defining the shape of sidewall 370 may be adjusted so that hypothetical ray 384 reflects off sidewall 370 such that ray 384 traverses exit face 355 with a desired exit angle 390 or projects light with a desired half angle 392.

In one embodiment, when fabricating a sidewall or calculating the angular subtense of a sidewall, finer subtenses may be used towards the base of the sidewall (i.e. nearer the phosphor layer) because the effects of the subtense are greater or more acute upon reflection near the base, and thus finer subtenses allow for a sidewall with better TIR properties, whereas further from the base, where the effects of the subtenses are less, the subtenses may be coarser. Thus, facets of a sidewall may be numerically greater towards the base of a lens body 107. In one embodiment, a sidewall may have 20 or more facets, with finer facets at the base of the sidewall, wherein the facets approximate one or more subtenses.

A facet can be a linear approximation of a portion of a parabola 388. The parameters of parabola 388 can be adjusted until the portion achieves the desired goal of all rays incident on the portion reflecting to exit face 355 such that the rays have an exit angle 390 of less than the critical angle. Each facet can be formed from a parabola having different parameters. Thus, a facet for one angular subtense may be based on a parabola while another facet is based on another parabola. A 20-facet sidewall, for example, may be based on 20 different parabolas.

Figure 17C:
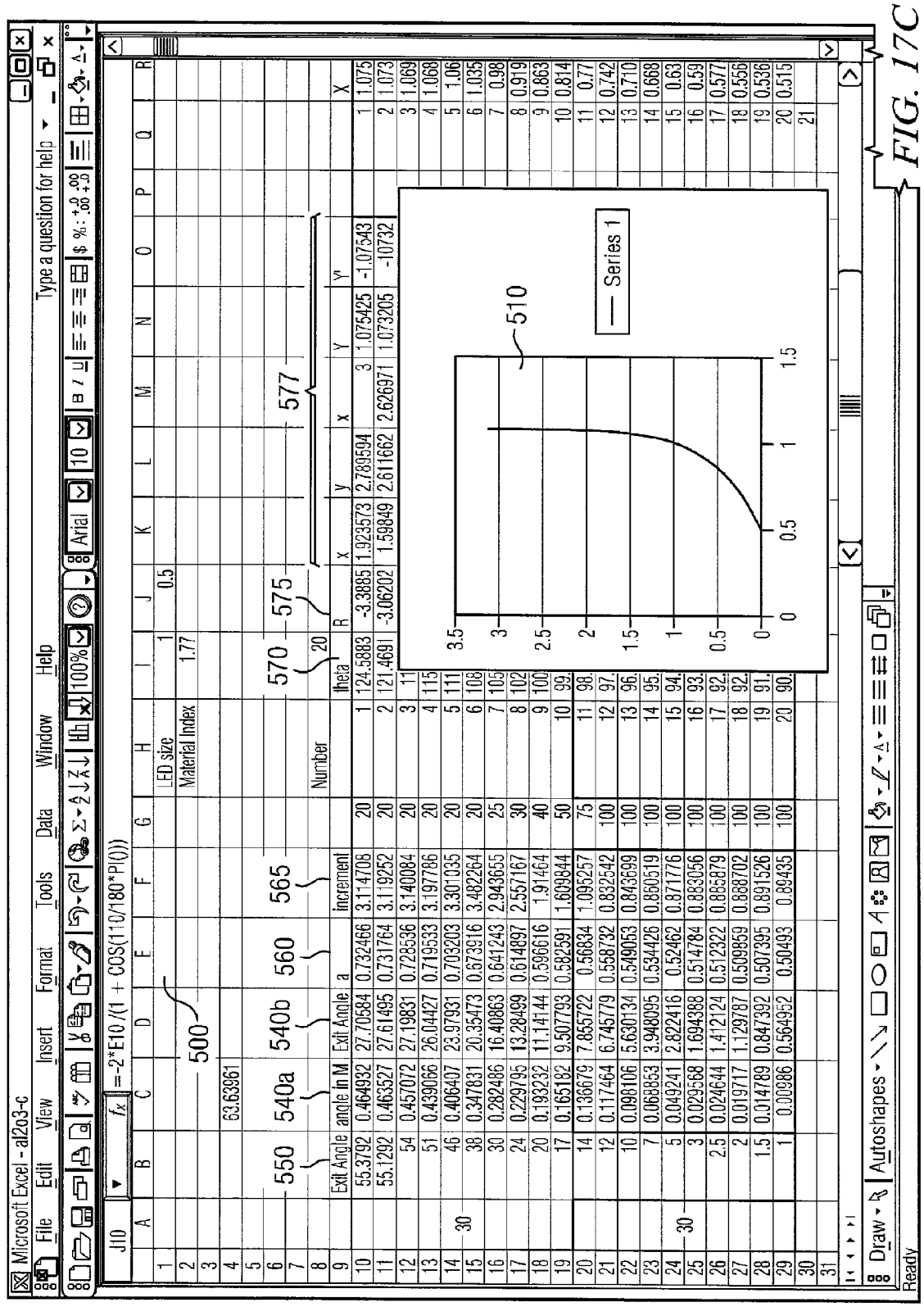
FIG. 17C is a diagrammatic representation illustrating that the facets for a sidewall can be defined using a computer program.

FIG. 17C depicts a spreadsheet 500 that can be utilized to design a sidewall shape as shown in graph 510 through the specification of angular subtenses. Projected half angle column 550 contains a plurality of angles that correspond to projected half angle 450 of FIG. 4B. Exit angle columns 540a (in radians) and 540b (in degrees) contain a plurality of exit angles corresponding to exit angle 392 of FIG. 17B. More particularly, all or a subset of the angles in column 540a may be angles that are less than the critical angle such that light rays intersecting the exit face at those angles traverse the exit face, exiting the shaped device. Columns 540a and 540b may be utilized to develop parabola focus column 560, containing a plurality of foci defining different parabolas. Angular subtense column 565 contains a plurality of angles (in radians) that define the limits of an angular subtense that can be used in conjunction with parabola focus column 560 to define the shape of a sidewall such that a ray reflects off the sidewall to exit the exit face at less than the critical angle. Using the values contained in parabola focus column 560 and angular subtense column 565, theta column 570 and radius column 575 can be developed wherein corresponding values in columns 570 and 575 correspond to points on a desired parabola for the angular subtense. In turn, theta column 570 and radius column 575 can be utilized to develop Cartesian coordinates for points on a sidewall (e.g. coordinate transformation columns 577) that approximate the parabola for the angular subtense.

For example, a user can specify the size of the entrance face of the shaped device (in this case marked LED size) and material index. The size can correspond to the size of the entrance face or emitting size of the phosphor layer. Using a hypothetical example of a size of 1, and an index of refraction of 1.77, a row in screen 500 can be completed as follows. The user can specify an exit angle in air (assuming air is the medium in which the lens will operate) in column 550. In the example of the first row, the user has selected 55.3792 degrees. The exit angle in the lens can be calculated as sin (55.3792/180*π)/.1.77 or 0.4649323 radians, column 540a. Column 540b can be calculated as a sin(0.4649323)/π* 180=27.2058407. The focus of the parabola can be calculated as 1(size)/2*(1+cos(π/2-27.2058407/180*π))=0.732466. Angular subtense column 565 can be calculated based on the number in the next column (representing the relative size of a particular facet) as (90-27.7058047)/20=3.114708. Theta column 570 can calculated using a selected number of facets (in this example 20). For example, in the first row theta is calculated as (90-27.7058407)+3,114708*20=124.5883. The radius of the parabola (column 575) for the first facet can be calculated as 2*.732466/(1+cos(124.5883/180*π)). The contents of coordinate transformation columns 577 can be calculated as follows for the first row: x=−3.3885*cos (124.5883/180*π)=1.923573; y=−3.3885*sin(124.5883/ 180*7π)=2.789594, X=1.923573*cos(27.7058407/180*π)+ 2.789594*sin(27.7058407/180*π); Y=2.789594*cos (27.7058407/180*π)−1.923573*sin(27.7058407/180*π)−1 (size)/2=1.075452 and Y'=−Y. The X, Y coordinates can then be used as data point inputs for a shape fitting chart in Excel. For example graph 510 is based on the data points in the X and Y columns (with the Y column values used as x-axis coordinates and the X column values used as y-axis coordinates in graph 510). In addition to the X and Y values a starting value can be set (e.g., 0.5 and 0). The shape from graph 510 can be entered into an optical design package and simulations run. If a simulation is unsatisfactory, the user can adjust the values in spreadsheet 500 until a satisfactory profile is achieved.

Figure 17D:
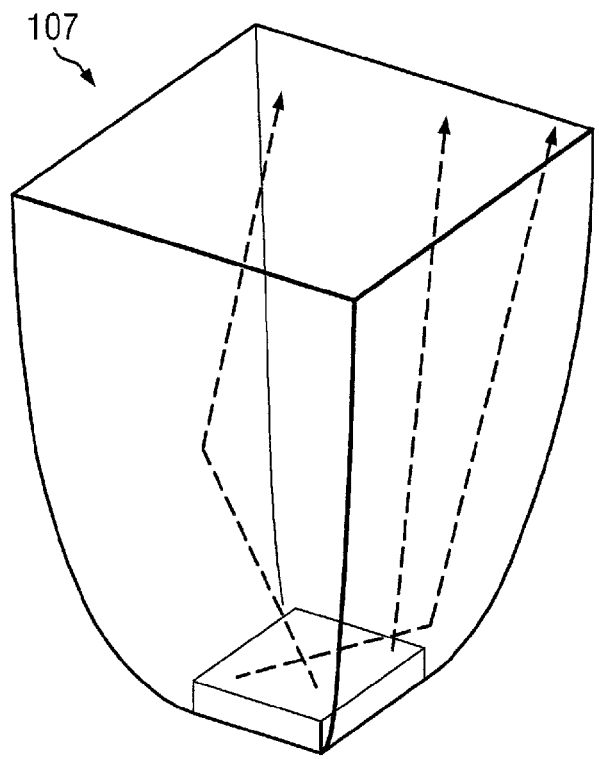
FIG. 17D is a diagrammatic representation of one embodiment of a lens with sidewalls shaped to cause TIR so that rays are reflected from the sidewalls to the exit surface.

When a satisfactory efficiency and intensity profile are achieved, a separate optical device can be formed having the specified parameters. An example of such a lens body 107 is shown in FIG. 17D which provides a diagrammatic representation of one embodiment of lens body 107 with sidewalls shaped to cause TIR so that rays are reflected from the sidewalls to the exit surface. The shape of each sidewall, in this embodiment, is a superposition of multiple contoured surfaces as defined by the various facets. While a curve fit is performed for ease of manufacturability, other embodiments can retain faceted sidewalls.

Figure 18:
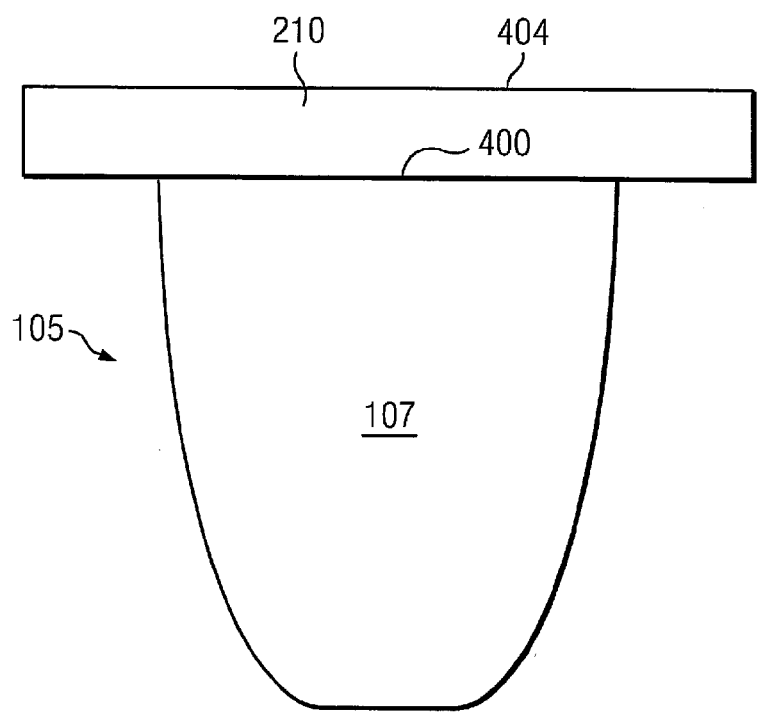
FIG. 18 is a diagrammatic representation illustrating one embodiment of an exit plane.

In the above example, it is assumed that the exit plane of light for purposes of shaping a lens is the exit face of the lens. However, as shown in the embodiment of FIG. 16, the exit plane of the shaped lens 105 may be the transition from shaped portion into another portion such as cover 210. If cover 210 is the same material as or has the same index of refraction as the shaped portion, the exit plane can be the transition between the shaped portion of lens body 107 and cover 210. FIG. 18, for example, illustrates a lens 105 having a shaped lens body 107 and cover 210 as an integrated lens 105. While light will exit the lens assembly through the cover 210, the transition 400 between shaped lens body 107 and cover 210 can serve as the "exit face" for determining the shape of lens 105 as described above. If cover 210 has the same index of refraction as lens body 107, then the critical angle at the used in shaping lens 105 will be the same as if transition 400 were exposed to the outside medium because if light traverses transition 400 at less than or equal to the critical angle, it will also be incident on surface 404 at less than or equal to the critical angle. If the index of refraction of cover 210 is lower (or any adhesives or other layers between cover 210 and lens body 107) is lower, the critical angle at the exit face will be the critical angle based on the lower index of refraction.

As discussed above, various boundary conditions, particularly the area of exit surface 155, are determined for the separate optical device so that brightness can be conserved. The minimum area of exit surface 155 can be determined from EQN. 1 above, which relies on various effective solid angles. Typically, the effective solid angle of light is determined based on equations derived from sources that radiate as Lambertian emitters, but that are treated as points because the distances of interest are much greater than the size of the source. The observed Radiant Intensity (flux/steradian) of a Lambertian source varies with the angle to the normal of the source by the cosine of that angle. This occurs because although the radiance (flux/steradian/m2) remains the same in all directions, the effective area of the source decreases to zero as the observed angle increases to 90 degrees. Integration of this effect over a full hemisphere results in a projected solid angle value equal to m steradians.

Figure 19:
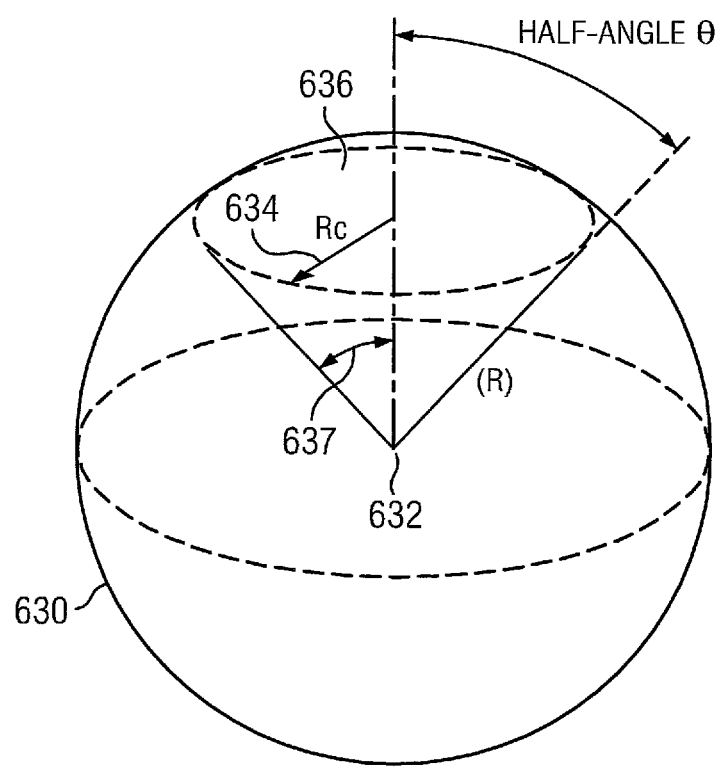
FIG. 19 is a diagrammatic representation of one embodiment for estimating effective solid angle.

Turning to FIG. 19, assume a sphere 630 of given radius (R) surrounds point source 632 (in this example, point source 632 approximates a Lambertian source at a significant distance). The projected area of a hemisphere of the sphere is $\pi R^2$ and the projected area of the full sphere is $2\pi R^2$. This model can be used to design lens because the phosphors can be modeled as a Lambertian emitter such that from any point on a hypothetical hemisphere centered over the interface, a given point on the interface will have the same radiance. The area $A_3$ can be calculated as the flat, circular surface (e.g., surface 636) that is subtended by the beam solid angle of interest using a radius of the circle 634 ($R_c$) that is the distance from the normal ray to the intersection of the spherical surface. For a given half angle 637 of θ of the beam, $R_C$ is the product of R (the radius of the sphere) and the sine of the angle θ, such that $$R_C = R*\text{Sin}(\theta) \quad \text{[EQN. 2]}$$

The area equals:

$$A_3 = \pi R_C^2 = \pi(R*\text{Sin}(\theta))^2 \quad \text{[EQN. 3A]}$$

The area $A_3$ is the projected area of the solid angle as it intersects the sphere. The area $A_3$ is divided by the projected area of the hemisphere ($A_h = \pi R^2$) and the quotient is multiplied by the projected solid angle of the full hemisphere (equal to π) to obtain the projected solid angle Ω, such that:

$$\Omega = \pi\{\text{projected area of desired solid angle}\}/(\text{projected area of hemisphere}) \quad \text{[EQN. 3B]}$$

$$\Omega = (\pi)*[\{\pi(R*\text{Sin}(\theta))^2\}/(\pi R^2)] \quad \text{[EQN. 3C]}$$

$$= \pi*\text{Sin}^2(\theta) \quad \text{[EQN. 4]}$$

For entrance face 150 of FIG. 1, for example, θ is 90 degrees, leading to a projected solid angle of $\pi*\text{Sin}^2$ (90), and for the desired half angle of 30 degrees, the projected solid angle is $\pi*\text{Sin}^2$ (30). Using these values for $\Omega_1$ and $\Omega_2$ for EQN. 1, $A_2$ can be determined for any half angle.

In the above example, the solid angle is determined using equations derived from a Lambertian source modeled as a point source. These equations do not consider the fact that light may enter a lens body 107 through an interface that may be square, rectangular, circular, oval or otherwise shaped. While the above-described method can give a good estimate of the solid angle, which can be later adjusted if necessary based on empirical or computer simulation testing, other methods of determining the effective solid angle can be used.

Figure 20A:
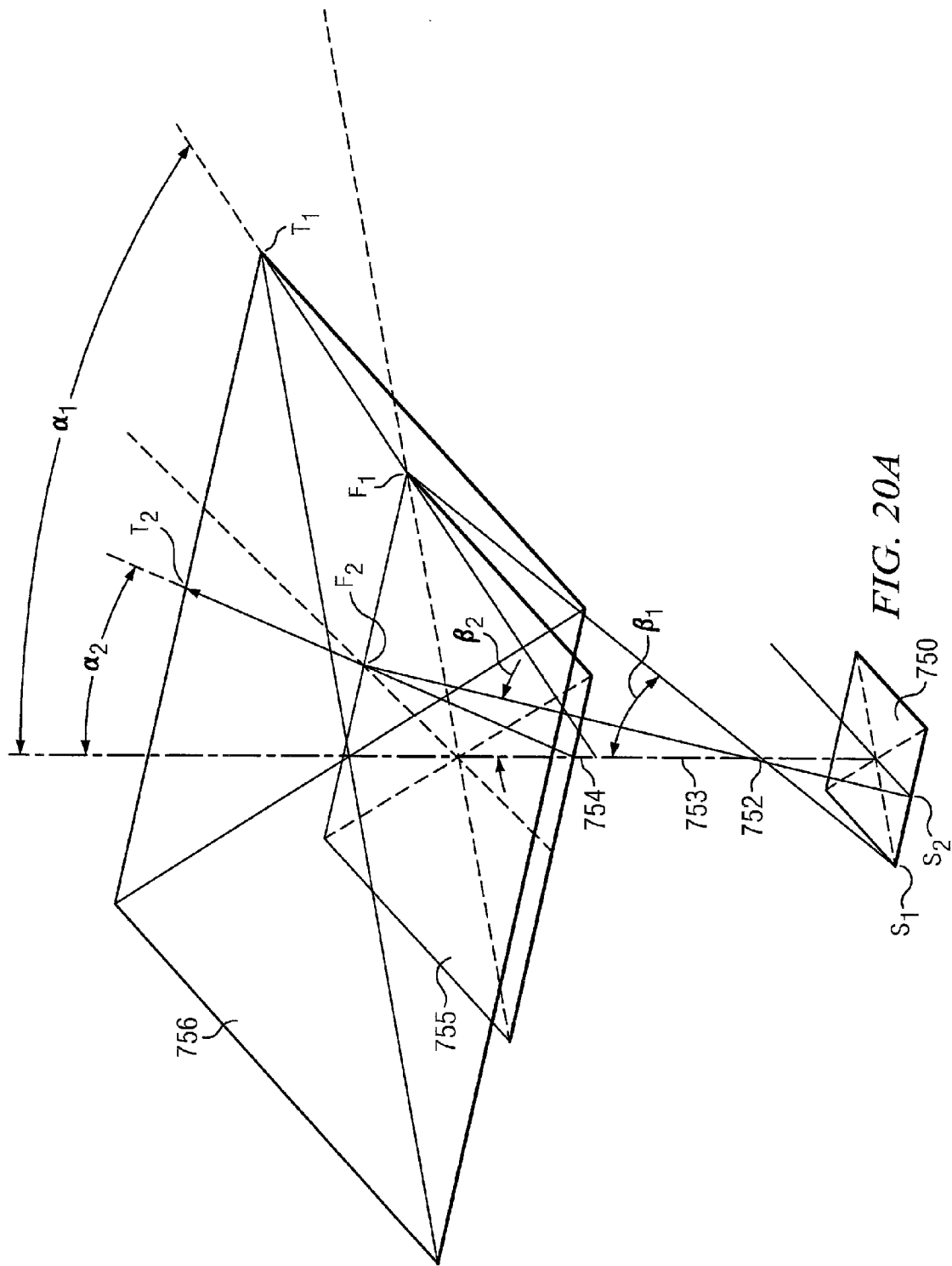
FIGS. 20A-20E are diagrammatic representations describing another embodiment for estimating effective solid angle.
Figure 20B:
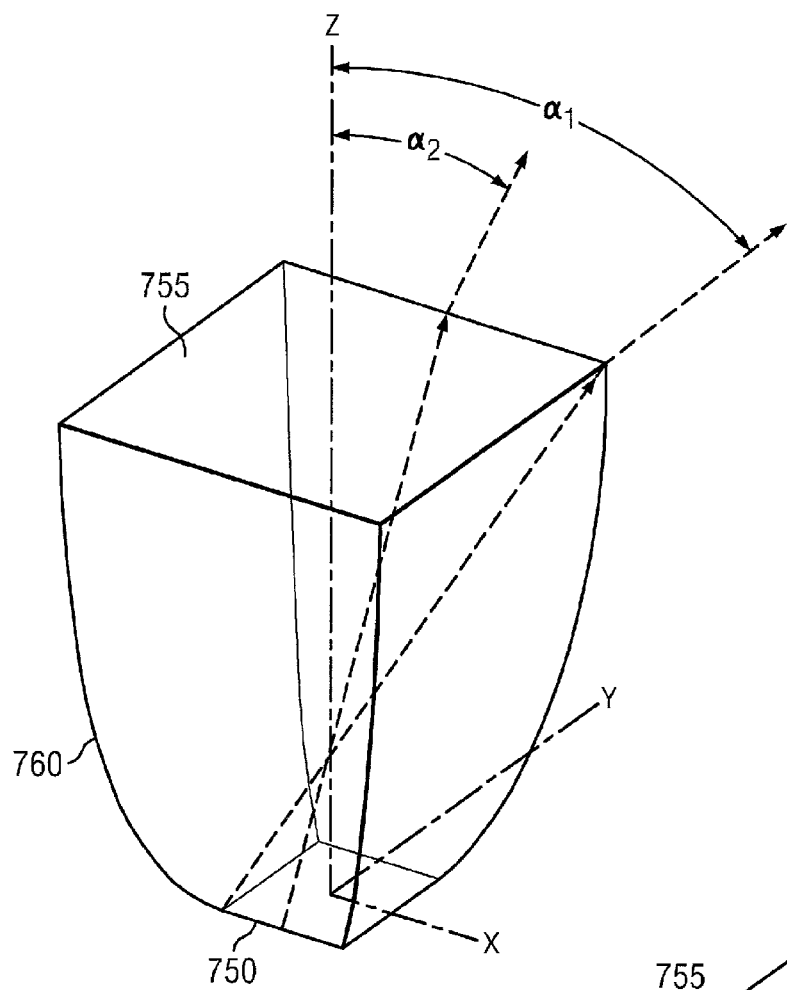

FIGS. 20A-20E describe another method for determining the effective solid angle for a lens. FIG. 20A is a diagrammatic representation of one embodiment of an entrance face 750 and an exit face 755 of a lens 760 and a hypothetical target plane 756 onto which light is projected. FIG. 20A illustrates examples for a position of an effective source origin 752, central normal 753 and effective output origin 754. For purposes of further discussion, it is assumed that the center of interface 750 is at 0,0,0 in a Cartesian coordinate system. Target plane 756 represents the parameters of the resulting pattern (e.g., size and half angle used by other optics). According to one embodiment, the half angle at the diagonal (shown as $\alpha_1$ in FIG. 20B) is the starting point. For example, if the desired light at target plane 756 has a maximum half angle of 30 degrees, $\alpha_1$ for a square- or rectangular-faced separate optical device is 30 degrees. The half-angle within the separate optical device (labeled $\beta_1$ and also shown in FIG. 20C) can then be determined according to:

$$n_2 \text{Sin}(\alpha_1) = n_1 \text{Sin}(\beta_1) \quad \text{[EQN. 5]}$$

where $n_1$ is the IOR of the lens 760;
   $n_2$ is the IOR of the material (typically air) into which the light is projected from the lens 760;
   $\alpha_1$ is the half angle at the exit face in the medium external to the lens 760;
   $\beta_1$ is the desired half angle of lens 760.

For example, if the desired half-angle α1 is 30 degrees, and a lens having an IOR of 1.5 is projecting into air having an IOR of 1, then $\beta_1 = 19.47$ degrees. A similar calculation can be performed for a ray projecting from a point on the long and short sides of entrance surface 150. For example, as shown in FIGS. 22B and 22C, $\alpha_2$ and $\beta_2$ can be determined for a ray traveling from the center of one edge on entrance surface 450 to the center of the opposite edge of exit surface 755. (The critical angle is the same at 19.47, but β1 is not the same as $\beta_2$. $\beta_2$ is determined by the geometry of the sides and the height to the optical device.)

Using the angles calculated, the location of an effective point source 757 can be determined. For a square entrance face 450, of length $l_1$, the effective point source will be located X=0, Y=0 and $$Z_{eps} = \frac{l_1}{\sqrt{2}*\tan(\beta_1)} \quad \text{[EQN. 6]}$$

Where $Z_{eps}$ is the distance the effective point source is displaced from the emitting surface of the LED.

Figure 20C:
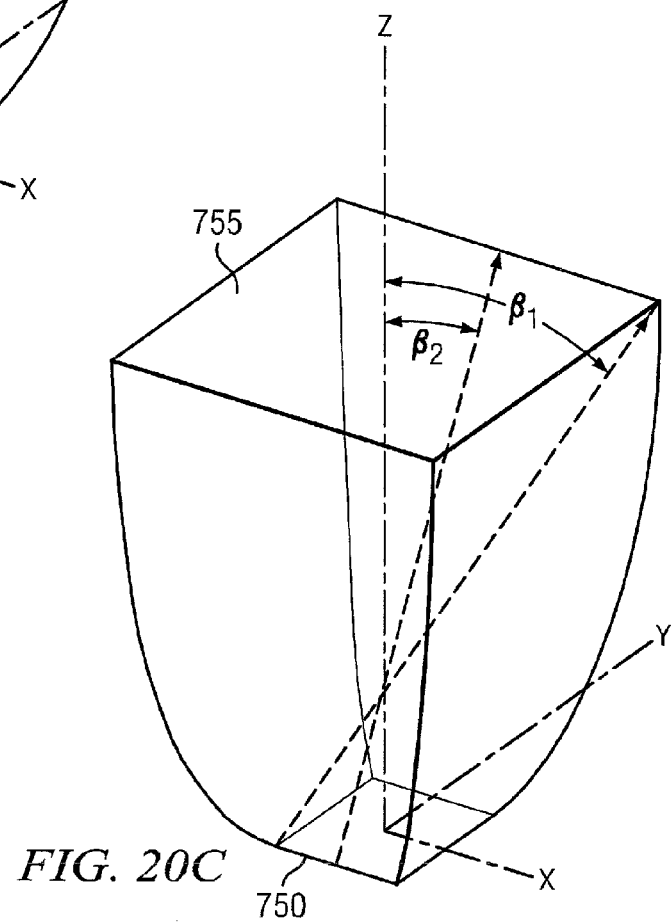

The X, Y and Z distances from the effective point source 757 to points $F_1$ and $F_2$ can be calculated assuming $F_1$ intersects a sphere of unity radius according to:

$$X_{F1} = \cos(\psi_1)\sin(\beta_1) \quad \text{[EQN. 7]}$$

$$Y_{F1} = \cos(\psi_1)\sin(\beta_1) \quad \text{[EQN. 8]}$$

$$Z_{F1} = \cos(\beta_1) \quad \text{[EQN. 9]}$$

$$X_{F2} = \cos(\psi_2) \quad \text{[EQN. 10]}$$

$$Y_{F2} = \sin(\beta_2) \quad \text{[EQN. 11]}$$

$$Z_{F2} = \cos(\beta_2) \quad \text{[EQN. 12]}$$

where $\psi_1$ is the angle of the diagonal ray in the X-Y plane (45 degrees for a square) and where $\psi_2 = 90$ degrees for a ray projecting from the middle of a side parallel to the X axis as shown in FIG. 20C. A similar methodology based on the geometries previously calculated can be used to determine other points (e.g., for example, the location of points $T_1$ and $T_2$ can be determined based on the location of points $F_1$ and $F_2$ and the desired half angle of light at target plane 756.)

Figure 20D:
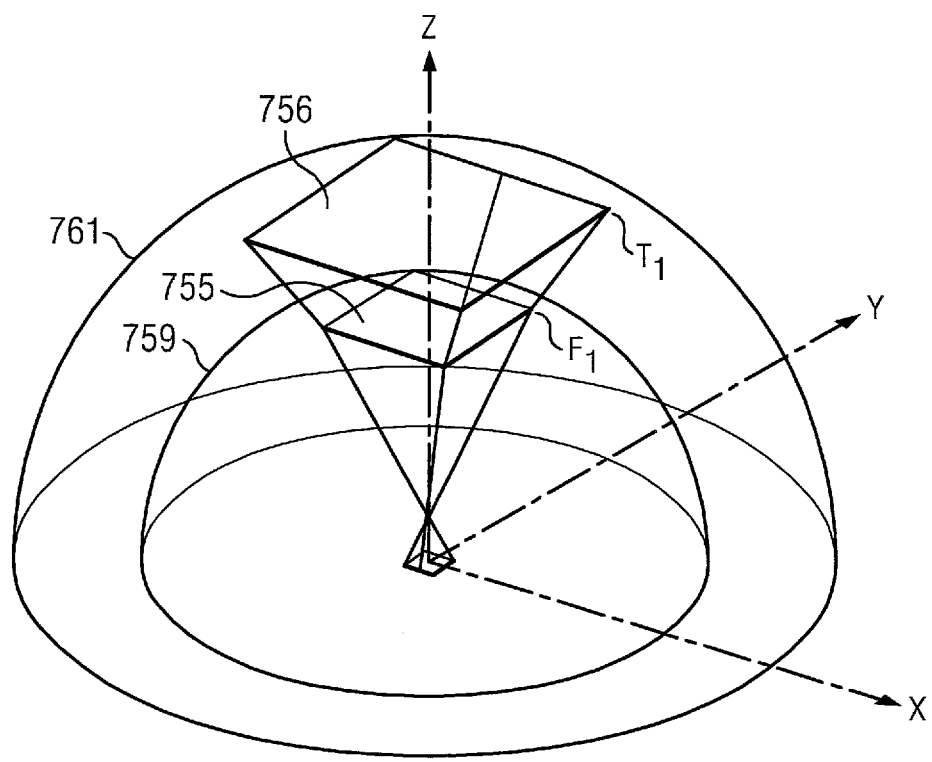
Figure 20E:
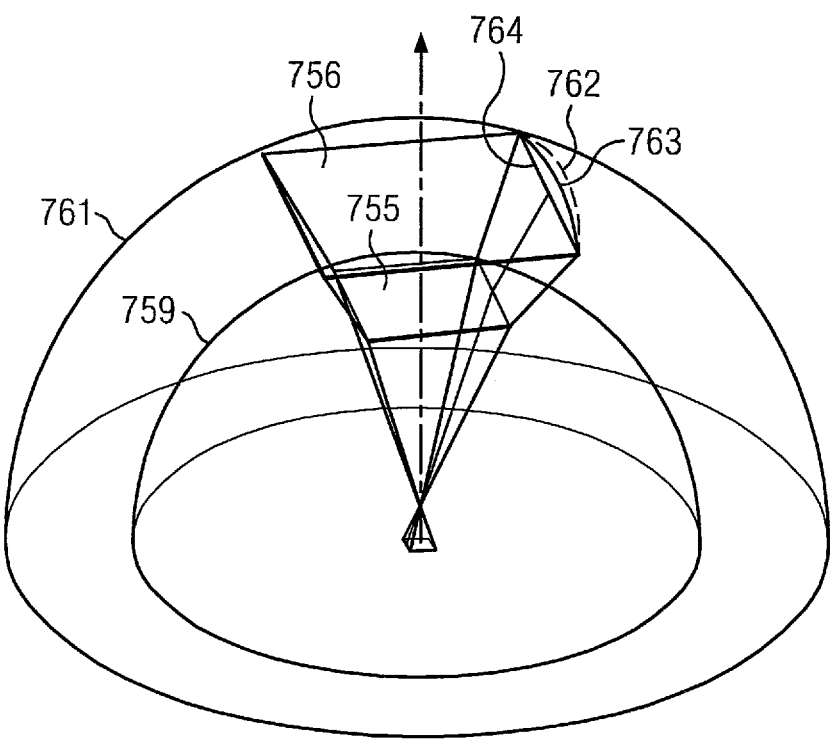

FIG. 20D illustrates the diagonal rays and one ray from the short side projected onto a sphere 759 for exit face 755 and sphere 761 for target plane 756. For exit face 755, the projection of the intersection of the edge rays at the sphere 759 onto the plane of the exit face 755, forms elliptical segments. Likewise, the projection of the diffracted exit rays at the edge of the target face intersect the sphere 761. FIG. 20E, for example, points out the circular intersection 763 of the rays lying in the plane formed by the edge 764 of target face 756 intersecting sphere 761 (illustrated at 762), and the projection 762 of that intersection onto the target plane 756. By calculating the area of each of the elliptical segments surrounding the square of the target face, and adding that to the area of the target face we find the total projected area of the target face, the effective solid angle can be determined for the target plane using EQN. 3B. Similarly, by using sphere 159 and the elliptical segments formed thereon by rays, the effective solid angle for the optical device can be determined. For example, the total projected area is determined as described above and inserted as "projected area of desired solid angle" in equation 3B.

As one illustrative example, using the above method for a half-angle of 30 degrees with a square LED and output face yields an effective solid angle of 0.552 steradians to the target in air. By contrast, the use of the traditional circular projected area with a 30 degree half angle would yield an effective solid angle of 0.785 steradians. When these values are then used in EQUATION 1, for given IORs and flux, the traditional (circular) calculation yields a required exit area that is undersized by about 30%. If one were to design a system using this approach, the applicable physics (conservation of radiance) would reduce the light output by 30% over the optimum design. Conversely, using the corrected effective solid angle described above calculates an exit face area that will produce 42% more light output than is achievable with the circular calculation.

Although particular methods of determining the effective solid angle for a separate optical device are described above, any method known or developed in the art can be used. Alternatively, the minimum surface area to conserve brightness can be determined empirically. Moreover, while the minimum surface area calculations above assume 100% of the emitting entrance face of the separate optical device is receiving light, the phosphor layer may be disposed over only a part of the entrance surface such that a smaller entrance surface area is used. The calculations of the minimum area of the exit plane can be adjusted to account of the actual area receiving light. That is, the actual area of the phosphor layer can used as $A_1$.

The lens body 107 can be optimized for use with a phosphor layer 145 as a uniform emitter at the entrance face using modeling as described above. Lenses according to embodiments described herein can project light into a desired cone angle of 10-60 degrees with a theoretical efficiency of up to 96% in the lens body (meaning that 96% of the light received from the phosphors is emitted in the desired half-angles with 4% Fresnel loss). The efficiency can be 100% without Fresnel losses. Even at only 70% efficiency, lens bodies can be used to provide greater efficiency than other technologies, while also producing uniform or near uniform intensity distributions at both near and far fields.

While examples discussed above, the lens body 107 can use TIR to cause reflection, in other embodiments, lens body 107 may have reflective coating or the sidewalls of a lens cavity can act as the reflector. Moreover, while it is assumed in the above examples that the critical angles are is the same for the sidewalls of the lens body as the exit face, they can be different. For example, a lens body 107 can be surrounded by a medium other than air in a lens cavity 107 while the exit face 155 or cover 210 is exposed to air.

Furthermore, while the above embodiments illustrate that each lens is used in conjunction with a single LED, a lens can also be used with an array of LEDs emitting light on the phosphor layer.

Figure 21:
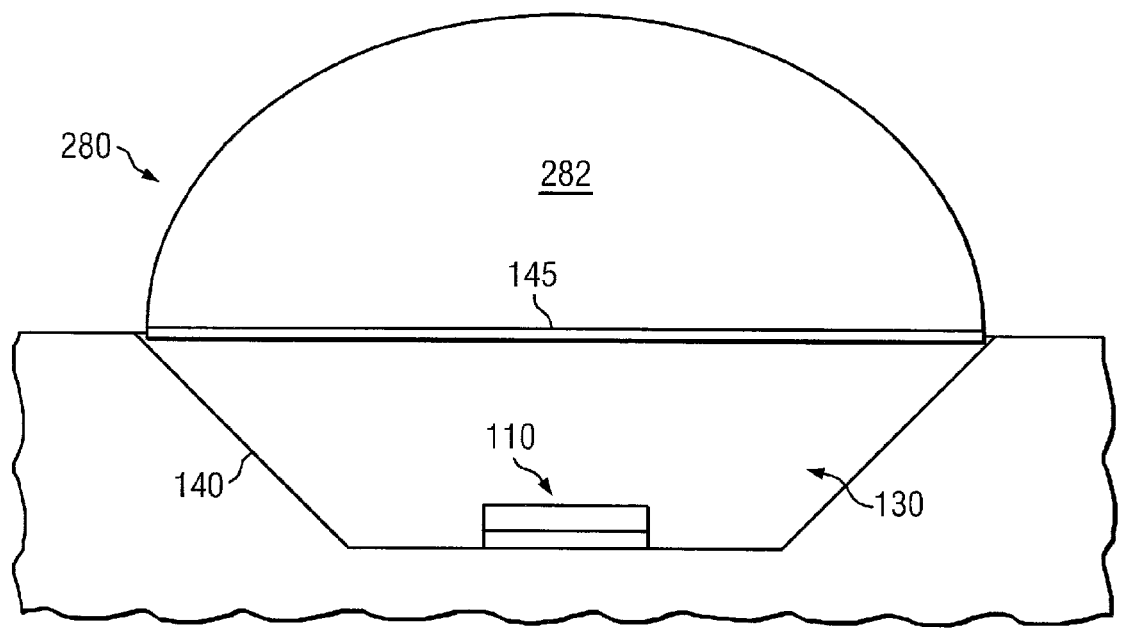
FIG. 21 is a diagrammatic representation of another embodiment of phosphor with a lens.

Moreover, other types of lenses may also be used. FIG. 21, for example, is a diagrammatic representation of one embodiment of a system in which a solid dome lens 280 is used. In the embodiment of FIG. 21, LED 110 is disposed in an LED cavity 130 having tapered sidewalls that act as a reflector 140. A layer of phosphor 145 covers the entrance face of the body 282 of dome lens 280.

Figure 22:
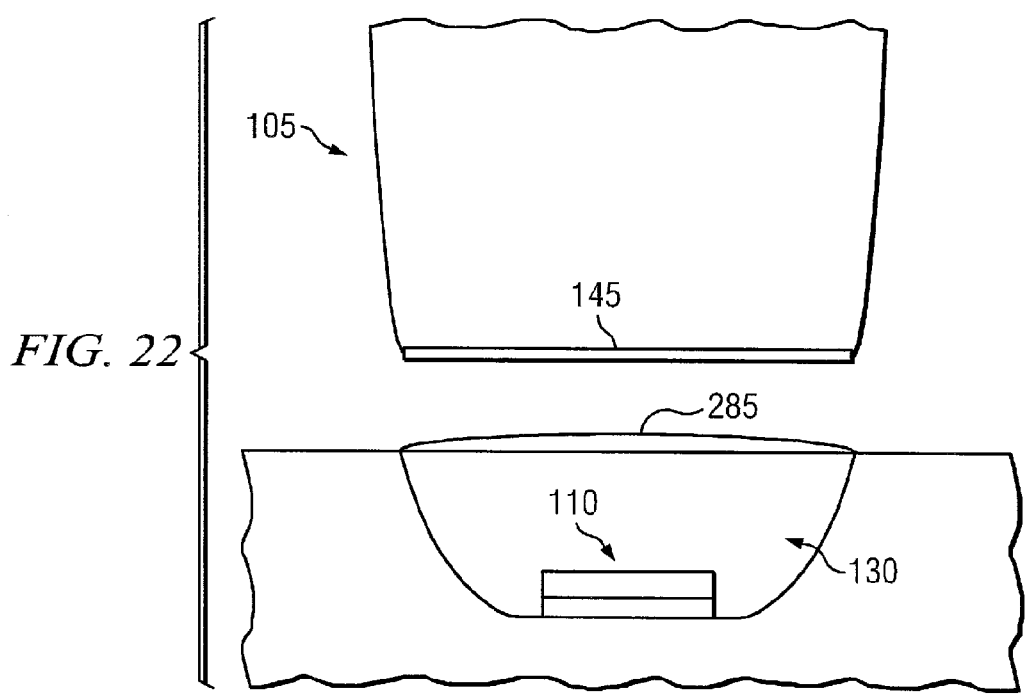
FIG. 22 is a diagrammatic representation of yet another phosphor with a lens.

FIG. 22 is a diagrammatic representation of another embodiment of an optical system. In the embodiment of FIG. 22, encapsulant in the LED cavity 130 around LED 110 forms a convex portion 285. A lens 105 having a phosphor coating 145 can be adhered to convex portion 275 or to a housing or another structure. The optical system can be assembled such that there is no air gap between lens 105 and convex portion 285. By way of example, but not limitation, lens 105 can include a concave entrance face. In another embodiment, an intermediate layer with a concave entrance face can be used.

Figure 23:
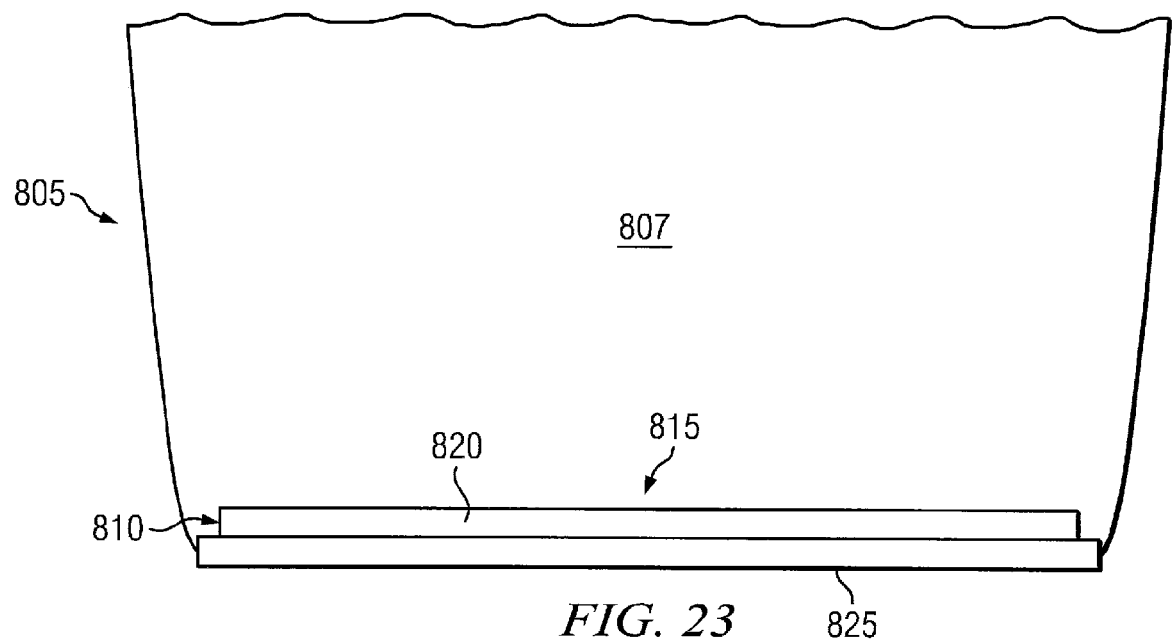
FIG. 23 is a diagrammatic representation of one embodiment of a lens with phosphor.
Figure 24:
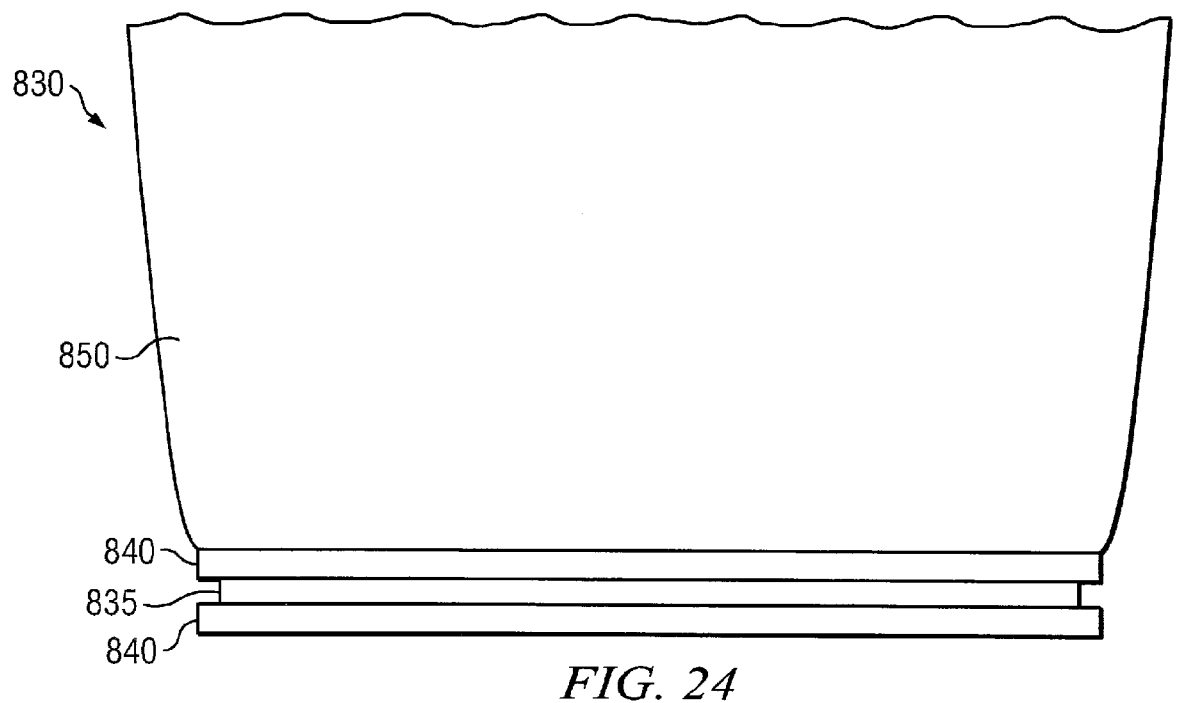
FIG. 24 is a diagrammatic representation of another lens with phosphor.

One of ordinary skill in the art would understand that phosphor can be disposed on a lens in a variety of manners. As discussed in conjunction with several embodiments above, phosphor can be applied as a coating to an entrance face or buffer layer. FIG. 23 is a diagrammatic representation of another embodiment. In the embodiment of FIG. 23, lens 805 includes a pocket 810 at the entrance face 815 to lens body 807. Phosphor particles 820 can be packed in the pocket and held in place with a binding material or with another layer 825 of material. Material 825 is preferably an optically transparent material that can withstand the temperatures of phosphor 820. FIG. 24 illustrates yet another embodiment of a lens 830 in which a layer of phosphor 835 is sandwiched between a buffer layer 840 and another layer of suitable material 845. The stack of layers can be coupled to a lens body 850. The layers of material can include glass, polycarbonate, silicon or other layers.

While this disclosure describes particular embodiments, it should be understood that the embodiments are illustrative and that the scope of the invention is not limited to these embodiments. Many variations, modifications, additions and improvements to the embodiments described above are possible. For example, the various ranges and dimensions provided are provided by way of example and LEDs and lenses may be operable within other ranges using other dimensions. It is contemplated that these variations, modifications, additions and improvements fall within the scope of the claims.

What is claimed is:

1. An optical system comprising:
    an LED disposed in a cavity defined by a base and one or more cavity sidewalls;
    a lens further comprising:
        a lens body having an entrance face substantially parallel to a primary emitting plane the LED; and
        a layer of phosphor between the entrance face of the lens body and the LED such that light emitted from the LED will be incident on the phosphor and down converted before entering the lens body through the entrance face;
    wherein the one or more cavity sidewalls are shaped to direct light incident on the one or more cavity sidewalls to the entrance face of the lens, wherein an encapsulant at least partially fills the cavity, wherein the encapsulant forms a reflector around the LED through surface tension,
    wherein the lens is positioned so that the phosphor is separated from the LED by a gap.

2. The optical system of 1, wherein the one or more cavity sidewalls are reflective.

3. The optical system of claim 1, wherein the layer of phosphor is disposed as a phosphor coating on the entrance face of the lens body.

4. The optical system of claim 1, wherein the phosphor is separated from the entrance face of the lens body by one or more layers of material.

5. The optical system of claim 4, wherein the phosphor layer is disposed on a buffer layer of material adapted to protect the lens body from heat generated by the phosphor.

6. An optical system comprising:
    an LED disposed in a cavity defined by a base and one or more cavity sidewalls;
    a lens further comprising:
        a lens body having an entrance face substantially parallel to a primary emitting plane the LED; and
        a layer of phosphor between the entrance face of the lens body and the LED such that light emitted from the LED will be incident on the phosphor and down converted before entering the lens body through the entrance face; and an encapsulant that at least partially fills the cavity, wherein the encapsulant forms a reflector around the LED through surface tension, wherein the lens is positioned so that the phosphor is separated from the LED by a gap, wherein the one or more cavity sidewalls are shaped to direct light incident on the one or more cavity sidewalls to an entrance face of the lens, wherein the lens body is shaped to emit light with a uniform distribution in a desired half-angle and to conserve brightness.

7. The optical system of claim 6, wherein the one or more cavity sidewalls are shaped to direct light incident the cavity sidewalls to the entrance face of the lens, wherein the cavity sidewalls are formed of a material that acts as a reflector of light produced by the LED and phosphor.

8. An optical system comprising:
a submount;
an array of LEDs mounted to the submount;
a housing, the housing at least partially defining a set of LED cavities in cooperation with the submount and a set of lens cavities, each lens cavity open to a corresponding LED cavity and sized to accommodate a lens;
a set of lenses disposed in the lens cavities, each lens comprising:
a lens body having an entrance face proximate to the opening to the corresponding LED cavity; and
a layer of phosphors between the entrance face and a corresponding LED such that light emitted by a corresponding LED will be down converted before entering the lens body;
wherein the entrance face of each lens is positioned a distance from a corresponding LED.

9. The optical system of claim 8, wherein the lens body of each lens in the set of lenses is configured to emit light with a uniform distribution pattern in a selected half-angle.

10. The optical system of claim 9, wherein the set of lenses is closely packed so that the optical system emits light in a uniform distribution pattern in the selected half-angle over a larger area than the illumination area of an individual lens in the set of lenses.

11. The optical system of claim 10, wherein the lens body of each lens in the set of lenses is shaped to conserve brightness.

12. The optical system of claim 8, wherein each lens cavity is defined by a set of sidewalls, wherein the sidewalls of each lens cavity are shaped so that the lens cavity is smaller proximate to the opening to the corresponding LED cavity and larger distal from the opening of the corresponding LED cavity.

13. The optical system of claim 12, further comprising a cover supporting one or more lenses in corresponding lens cavities.

14. The optical system of claim 13, wherein the cover and one or more lens bodies are formed of a single piece of material.

15. The optical system of claim 8, wherein the layer of phosphors is selected so that different lenses in the set of lenses emit different colors of light.

16. The optical system of claim 8, wherein the layer of phosphors is selected so that the optical system forms one or more white light units.

* * * * *